United States Patent
Pentlehner et al.

(10) Patent No.: US 10,147,773 B2
(45) Date of Patent: Dec. 4, 2018

(54) ORGANIC LIGHT-EMITTING DIODE DEVICE

(71) Applicant: OSRAM OLED GmbH, Regensburg (DE)

(72) Inventors: Dominik Pentlehner, Regensburg (DE); Andreas Rausch, Regensburg (DE); Thomas Wehlus, Lappersdorf (DE); Carola Diez, Regensburg (DE); Nina Riegel, Tegernheim (DE); Britta Goeoetz, Regensburg (DE); Georg Dirscherl, Tegernheim (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 15/548,805

(22) PCT Filed: Feb. 2, 2016

(86) PCT No.: PCT/EP2016/052144
§ 371 (c)(1),
(2) Date: Aug. 4, 2017

(87) PCT Pub. No.: WO2016/124571
PCT Pub. Date: Aug. 11, 2016

(65) Prior Publication Data
US 2018/0019289 A1 Jan. 18, 2018

(30) Foreign Application Priority Data
Feb. 5, 2015 (DE) .................. 10 2015 101 688

(51) Int. Cl.
*H01L 29/08* (2006.01)
*H01L 27/32* (2006.01)
*H01L 51/52* (2006.01)

(52) U.S. Cl.
CPC ........ *H01L 27/3232* (2013.01); *H01L 27/322* (2013.01); *H01L 51/5268* (2013.01); *H01L 51/5275* (2013.01); *H01L 2251/5361* (2013.01)

(58) Field of Classification Search
None
See application file for complete search history.

(56) References Cited

U.S. PATENT DOCUMENTS

2014/0148877 A1\* 5/2014 Pan .................... A61N 5/0613
607/88

FOREIGN PATENT DOCUMENTS

DE 102007054039 A1 3/2009
DE 102012205413 A1 10/2013
(Continued)

OTHER PUBLICATIONS

German Search Report based on application No. 10 2015 101 688.5 (10 pages) dated Jan. 29, 2016 (for reference purpose only).
(Continued)

*Primary Examiner* — Hung Vu
(74) *Attorney, Agent, or Firm* — Viering Jentschura & Partner MBB

(57) ABSTRACT

According to the present disclosure, an organic light-emitting diode device is disclosed with an organic light-emitting diode having a first main surface and a second main surface lying opposite the first main surface, an optically functional device having a first hollow space and a second hollow space, and a control element. The first hollow space is arranged on or over the first main surface, and the second hollow space is arranged below the second main surface. The first hollow space and the second hollow space are connected to one another by means of a fluid connection. An optically functional fluid is arranged in the optically functional device. The control element is configured to move the (Continued)

optically functional fluid to and fro between the first hollow space and the second hollow space.

19 Claims, 12 Drawing Sheets

(56) References Cited

FOREIGN PATENT DOCUMENTS

| | | |
|---|---|---|
| DE | 102013106992 A1 | 1/2015 |
| EP | 1921471 A1 | 5/2008 |
| WO | 2012042441 A1 | 4/2012 |
| WO | 2013023663 A1 | 2/2013 |
| WO | 2014141019 A1 | 9/2014 |

OTHER PUBLICATIONS

International Search Report based on application No. PCT/EP2016/052144 (9 pages) dated Jul. 5, 2016 (Reference Purpose Only).

\* cited by examiner

ORGANIC LIGHT-EMITTING DIODE DEVICE

RELATED APPLICATIONS

The present application is a national stage entry according to 35 U.S.C. § 371 of PCT application No.: PCT/EP2016/052144 filed on Feb. 2, 2016, which claims priority from German application No.: 10 2015 101 688.5 filed on Feb. 5, 2015, and is incorporated herein by reference in its entirety.

TECHNICAL FIELD

The present disclosure relates to an organic light-emitting diode device.

BACKGROUND

An organic light-emitting diode device may for example include one, two or more light-emitting diode elements. The light-emitting diode elements may, for example, be organic light-emitting diodes (OLEDs) or parts or segments of organic light-emitting diodes (OLEDs).

SUMMARY

The object of the present disclosure is to provide a particularly versatilely usable and particularly efficient organic light-emitting diode device.

According to a first aspect of the present disclosure, the object is achieved by an organic light-emitting diode device which includes an organic light-emitting diode having a first main surface and a second main surface lying opposite the first main surface. The organic light-emitting diode device furthermore includes an optically functional device having a first hollow space and a second hollow space. The organic light-emitting diode device furthermore includes a control element. The first hollow space is arranged on or over the first main surface, and the second hollow space is arranged below the second main surface. The first and the second hollow spaces are connected to one another by means of a fluid connection. An optically functional fluid is arranged in the optically functional device. The control element is configured to move the optically functional fluid to and fro between the first hollow space and the second hollow space. Movement of the optically functional fluid to and fro makes it possible for the organic light-emitting diode device to have adjustable optical properties. A particularly versatilely usable organic light-emitting diode device is therefore provided.

According to one refinement, the optically functional fluid includes a first solvent and a second solvent, wherein the first solvent and the second solvent are essentially immiscible with one another. In this way, the first solvent and the second solvent can be arranged alternately in the first hollow space, so that the organic light-emitting diode device can have alternating optical properties.

According to another aspect of the present disclosure, the object is achieved by an organic light-emitting diode device which includes an organic light-emitting diode. The organic light-emitting diode device furthermore includes a carrier having a first optically active region and an optically inactive region arranged next to the optically active region. The organic light-emitting diode device furthermore includes an optically functional device having a first hollow space and a second hollow space. The organic light-emitting diode device furthermore includes a housing element in the optically inactive region, and a control element. The first and the second hollow spaces are connected to one another by means of a fluid connection. The organic light-emitting diode is formed in the optically active region. The first hollow space is formed on or over the organic light-emitting diode and in the optically active region. The second hollow space is formed on or over the carrier and between the carrier and the housing element in the optically inactive region. An optically functional fluid is arranged in the optically functional device. The control element is configured to move the optically functional fluid to and fro between the first hollow space and the second hollow space. Movement of the optically functional fluid to and fro makes it possible for the organic light-emitting diode device to have adjustable optical properties. A particularly versatilely usable organic light-emitting diode device is therefore provided.

According to one refinement, the organic light-emitting diode includes an encapsulation and the first hollow space is formed on the encapsulation. For example, the encapsulation of the organic light-emitting diode increases the lifetime of the organic light-emitting diode. Furthermore, by forming the first hollow space on the encapsulation it is possible to make the organic light-emitting diode device particularly flat, so that for example the organic light-emitting diode device can be used particularly versatilely.

According to one refinement, the first hollow space includes at least one first wetting electrode and/or the second hollow space includes at least one second wetting electrode. Wetting electrodes in the first hollow space and/or the second hollow space make it possible to move the optically functional fluid to and fro by means of the wetting electrodes. This allows a particularly flat construction of the organic light-emitting diode device, so that it can be used particularly versatilely.

According to one refinement, the control element is configured in such a way that, by means of the control element, a first electrical potential can be applied to the at least first wetting electrode and/or a second electrical potential can be applied to the at least second wetting electrode. This allows a particularly flat construction of the organic light-emitting diode device, so that it can be used particularly versatilely.

According to one refinement, the control element is configured to move the optically functional fluid to and fro between the first hollow space and the second hollow space as a function of an operating voltage of the organic light-emitting diode. This makes it possible to move the optically functional fluid to and fro as a function of the operating voltage. A very versatilely usable organic light-emitting diode device is thereby provided.

According to another aspect of the present disclosure, the object is achieved by an organic light-emitting diode device which includes an organic light-emitting diode, an optically functional device and a control element. The optically functional device includes a nonresilient cover body arranged in the beam path of the organic light-emitting diode and a resilient frame. The nonresilient cover body and the resilient frame form a first hollow space. The control element is configured to vary the volume of the first hollow space by deformation of the resilient frame. This makes it possible to modify the optical properties of the organic light-emitting diode device by means of a volume change of the first hollow space. The organic light-emitting diode device can therefore be used particularly versatilely.

According to one refinement, the resilient frame has a modulus of elasticity of about less than or equal to 1 kN/mm$^2$, for example about less than or equal to 0.5 kN/mm$^2$, for example about less than or equal to 0.1 kN/mm$^2$. This makes it possible to modify the optical properties of the organic light-emitting diode device by means of a particularly efficient volume change of the first hollow space. The organic light-emitting diode device is therefore particularly efficient.

According to one refinement, the optically functional device furthermore includes a second hollow space outside the beam path of the organic light-emitting diode, and an optically functional fluid is arranged in the optically functional device. This makes it possible for the optically functional fluid to be movable almost fully from the first hollow space into the second hollow space. It is therefore possible to achieve a state of the organic light-emitting diode device in which the beam path is free of the optically functional fluid. A very versatilely usable organic light-emitting diode device is therefore provided.

According to one refinement, the control element includes a pump. This makes it possible to modify the optical properties of the organic light-emitting diode device particularly efficiently.

According to one refinement, the optically functional fluid includes scattering particles. This makes it possible to adapt the light-scattering properties of the organic light-emitting diode device. The organic light-emitting diode device can therefore be used particularly versatilely.

According to one refinement, the optically functional fluid includes a conversion material. This makes it possible to adapt the conversion properties of the organic light-emitting diode device. The organic light-emitting diode device can therefore be used particularly versatilely.

According to another aspect of the present disclosure, the object is achieved by an organic light-emitting diode device which includes an organic light-emitting diode and a resilient optically functional layer. The resilient optically functional layer has a first extent along a first direction and a second extent along a second direction. The resilient optically functional layer is arranged in the beam path of the organic light-emitting diode. The second direction is perpendicular to the first direction. The resilient optically functional layer is configured to reduce the second extent in the event of an increase in the first extent. This makes it possible to adapt the optical properties of the organic light-emitting diode device by means of a variation of the first extent and the second extent by modifying the layer thickness of the resilient optically functional layer. The organic light-emitting diode device can therefore be used particularly versatilely.

According to one refinement, the resilient optically functional layer includes or is formed from a resilient polymer. This makes it possible to modify the first extent and the second extent particularly efficiently.

According to one refinement, the resilient optically functional layer includes or is formed from a conversion material. The organic light-emitting diode device therefore includes a resilient optically functional layer having a converter material. The layer thickness of this layer may, for example, be modified in a straightforward way by pulling on the layer or by pressing on the layer. In this way, the conversion properties of this layer can likewise be modified in a straightforward way.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the appended drawings, which form part of this description and in which specific embodiments, in which the present disclosure may be carried out, are shown for illustration. In this regard, direction terminology such as "up", "down", "forward", "backward", "front", "rear", etc. is used with reference to the orientation of the figure or figures being described. Since component parts of embodiments may be positioned in a number of different orientations, the direction terminology is used for illustration and is in no way restrictive. It is to be understood that other embodiments may be used and structural or logical variations may be carried out, without departing from the protective scope of the present disclosure. It is to be understood that the features of the various embodiments described herein may be combined with one another, unless otherwise specifically indicated. The following detailed description is therefore not to be interpreted in a restrictive sense, and the protective scope of the present disclosure is defined by the appended claims.

In the scope of this description, the terms "connected" and "coupled" are used to describe both direct and indirect connection, and direct or indirect coupling. In the figures, elements which are identical or similar are provided with identical references, insofar as this is expedient.

An organic light-emitting diode device (organic light-emitting diode, OLED) may have one, two or more organic light-emitting diodes. Optionally, an organic light-emitting diode device may also include one, two or more electronic components. An electronic component may, for example, include an active and/or a passive component. An active electronic component may for example include a driver circuit, an energy source, a computation, control and/or regulating unit, and/or a transistor. A passive electronic component may for example include a capacitor, a resistor, a diode or an inductor.

An organic light-emitting diode device is a semiconductor light-emitting diode which emits electromagnetic radiation. An organic light-emitting diode may be part of an integrated circuit. A light-emitting diode may for example emit light in the visible range, UV light and/or infrared light.

Figure 1:
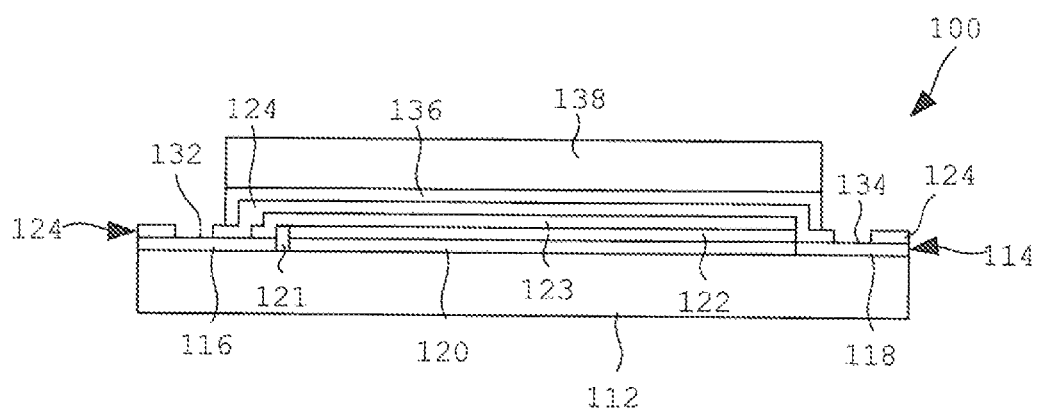
FIG. 1 shows a cross-sectional view of a region of one embodiment of an organic light-emitting diode device.

FIG. 1 shows one embodiment of an organic light-emitting diode 100. The organic light-emitting diode 100 may be configured as a flat component, for example as a flat light source. The organic light-emitting diode 100 includes a carrier 112. The carrier 112 may be configured to be translucent or transparent. The carrier 112 is used as a carrier element for electronic elements or layers, for example light-emitting elements. The carrier 112 may for example include or be formed from plastic, metal, glass, quartz and/or a semiconductor material. Furthermore, the carrier 112 may include or be formed from a plastic film or a laminate having one or more plastic films. The carrier 112 may be configured to be mechanically rigid or mechanically flexible.

An optoelectronic layer structure is formed on the carrier 112. The optoelectronic layer structure includes a first electrode layer 114, which includes a first contact section 116, a second contact section 118 and a first electrode 120. The carrier 112 with the first electrode layer 114 may also be referred to as a substrate. A first barrier layer (not represented), for example a first barrier thin film, may be formed between the carrier 112 and the first electrode layer 114.

The first electrode 120 is electrically insulated from the first contact section 116 by means of an electrical insulation barrier 121. The second contact section 118 is electrically coupled to the first electrode 120 of the optoelectronic layer structure. The first electrode 120 may be configured as an anode or as a cathode. The first electrode 120 may be configured to be translucent or transparent. The first electrode 120 includes an electrically conductive material, for example metal and/or a transparent conductive oxide (TCO), or a layer stack of a plurality of layers which include metals or TCOs. The first electrode 120 may, for example, include a layer stack of a combination of a layer of a metal on a layer of a TCO, or vice versa. One example is a silver layer which is applied on an indium tin oxide (ITO) layer (Ag on ITO), or ITO-Ag-ITO multilayers. As an alternative or in addition to the aforementioned materials, the first electrode 120 may include: networks of metal nanowires and nanoparticles, for example of Ag, networks of carbon nanotubes, graphene particles and layers and/or networks of semiconducting nanowires.

Formed over the first electrode 120, there is an optically functional layer structure, for example an organic functional layer structure 122, of the optoelectronic layer structure. The organic functional layer structure 122 may for example include one, two or more sublayers. For example, the organic functional layer structure 122 may include a hole injection layer, a hole transport layer, an emitter layer, an electron transport layer and/or an electron injection layer. The hole injection layer is used to reduce the band gap between the first electrode and the hole transport layer. In the hole transport layer, the hole conductivity is greater than the electron conductivity. The hole transport layer is used for transporting the holes. In the electron transport layer, the electron conductivity is greater than the hole conductivity. The electron transport layer is used for transporting the electrons. The electron injection layer is used to reduce the band gap between the second electrode and the electron transport layer. Furthermore, the organic functional layer structure 122 may include one, two or more functional layer structure units, which respectively include the aforementioned sublayers and/or further intermediate layers.

Formed over the organic functional layer structure 122 there is a second electrode 123 of the optoelectronic layer structure, which is electrically coupled to the first contact section 116. The second electrode 123 may be formed according to one of the configurations of the first electrode 120, wherein the first electrode 120 and the second electrode 123 may be configured identically or differently. The first electrode 120 is used, for example, as an anode or cathode of the optoelectronic layer structure. In accordance with the first electrode, the second electrode 123 is used as a cathode or anode of the optoelectronic layer structure.

The optoelectronic layer structure is an electrically and/or optically active region. The active region is, for example, the region of the optoelectronic component 100 in which electrical current for operation of the optoelectronic component 100 flows and/or in which electromagnetic radiation is generated or absorbed. A getter structure (not represented) may be arranged on or over the active region. The getter layer may be configured to be translucent, transparent or opaque. The getter layer may include or be formed from a material which absorbs and binds substances that are harmful to the active region.

Formed over the second electrode 123 and partially over the first contact section 116 and partially over the second contact section 118, there is an encapsulation layer 124 of the optoelectronic layer structure which encapsulates the optoelectronic layer structure. The encapsulation layer 124 is furthermore also referred to as encapsulation 124. The encapsulation layer 124 may be configured as a second barrier layer, for example as a second barrier thin film. The encapsulation layer 124 may also be referred to as thin-film encapsulation 124. The encapsulation layer 124 forms a barrier against chemical contaminants or atmospheric substances, in particular against water (moisture) and oxygen. The encapsulation layer 124 may be formed as a single layer, a layer stack or a layer structure. The encapsulation layer 124 may include or be formed from: aluminum oxide, zinc oxide, zirconium oxide, titanium oxide, hafnium oxide, tantalum oxide, lanthanum oxide, silicon oxide, silicon nitride, silicon oxynitride, indium tin oxide, indium zinc oxide, aluminum-doped zinc oxide, poly(p-phenylene terephthalamide), nylon 66, as well as mixtures and alloys thereof. Optionally, the first barrier layer may be formed on the carrier 112 in accordance with one configuration of the encapsulation layer 124.

In the encapsulation layer 124, a first recess of the encapsulation layer 124 is formed over the first contact section 116 and a second recess of the encapsulation layer 124 is formed over the second contact section 118. A first contact region 132 is exposed in the first recess of the encapsulation layer 124 and a second contact region 134 is exposed in the second recess of the encapsulation layer 124. The first contact region 132 is used for electrically contacting the first contact section 116 and the second contact region 134 is used for electrically contacting the second contact section 118.

A bonding layer 136 is formed over the encapsulation layer 124. The bonding layer 136 includes for example a bonding agent, for example an adhesive, for example a laminating adhesive, a coating and/or a resin. The bonding layer 136 may, for example, include particles which scatter electromagnetic radiation, for example light-scattering particles.

A cover body 138 is formed over the bonding layer 136. The bonding layer 136 is used for fastening the cover body 138 on the encapsulation layer 124. The cover body 138 includes, for example, plastic, glass and/or metal. For example, the cover body 138 may be formed essentially from glass and include a thin metal layer, for example a metal foil, and/or a graphite layer, for example a graphite laminate, on the glass body. The cover body 138 is used to protect the conventional optoelectronic component 100, for example against the effects of mechanical force from the outside. Furthermore, the cover body 138 may be used to distribute and/or dissipate heat which is generated in the conventional optoelectronic component 100. For example, the glass of the cover body 138 may be used as protection against external influences, and the metal layer of the cover body 138 may be used to distribute and/or dissipate the heat given off during operation of the conventional optoelectronic component 100. According to one embodiment, the cover body 138 is configured like the carrier 112.

Figure 2A:
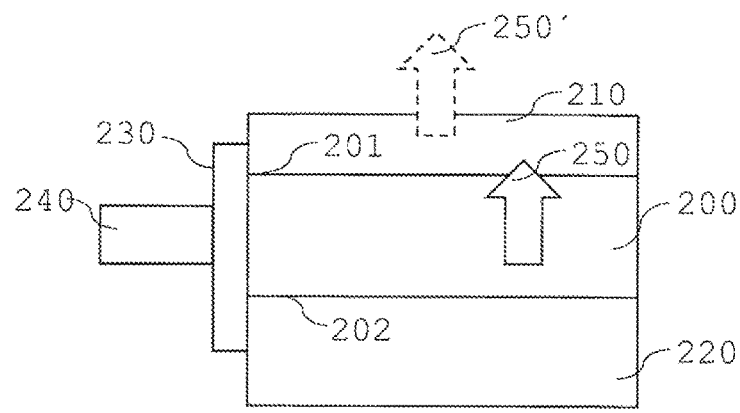
FIG. 2A shows a cross-sectional view of one embodiment of an organic light-emitting diode device.

FIG. 2A shows an embodiment of an organic light-emitting diode device. The organic light-emitting diode device includes an organic light-emitting diode 200 having a first main surface 201 and a second main surface 202 lying opposite the first main surface 201. The organic light-emitting diode device furthermore includes an optically functional device having a first hollow space 210 and a second hollow space 220. The organic light-emitting diode device furthermore includes a control element 240. The first hollow space 210 is arranged on or over the first main surface 201, and the second hollow space 220 is arranged below the second main surface 202. The first hollow space 210 and the second hollow space 220 are connected to one another by means of a fluid connection 230. An optically functional fluid is arranged in the optically functional device. The control element 240 is configured to move the optically functional fluid to and fro between the first hollow space 210 and the second hollow space 220.

The organic light-emitting diode 200 is configured according to an embodiment of the organic light-emitting diode 100 as described above. Main surfaces of the organic light-emitting diode 200 may refer to any surfaces which bound the organic light-emitting diode 200 outward. The first main surface 201 may also be referred to as a main emission surface 201. The first main surface 201 and the second main surface 202 are arranged parallel to one another. The first main surface 201 lies in the beam path of the organic light-emitting diode 200. The second main surface 202 lies on the opposite side of the organic light-emitting diode 200 from the beam path. For example, in a case in which the organic light-emitting diode 200 is configured as a bottom emitter, the carrier of the organic light-emitting diode may form the first main surface 201. For example, in a case in which the organic light-emitting diode 200 is configured as a top emitter, the encapsulation 124 or the cover body 138 may form the first main surface 201.

The first hollow space 210 includes a structure enclosing the first hollow space 210, furthermore also referred to as a first hollow space structure. The structure enclosing the first hollow space 210 is transparent for at least one electromagnetic radiation emitted by the organic light-emitting diode 200. The first hollow space 210 is configured to be flat. The structure enclosing the first hollow space 210 includes or is formed from a glass. One embodiment of a structure enclosing the first hollow space 210 is shown by way of example in FIG. 3C, and will be described in detail below. According to one embodiment, the first hollow space 210 includes or is formed from a transparent plastic. According to one embodiment, the first hollow space structure includes or is formed from a material that is described above in connection with the carrier 112 and/or the cover body 138. According to one embodiment, the first hollow space 210 includes a first hollow space opening and the second hollow space 220 includes a second hollow space opening. The second hollow space 220 may be configured according to one embodiment of the first hollow space 210.

Figure 2B:
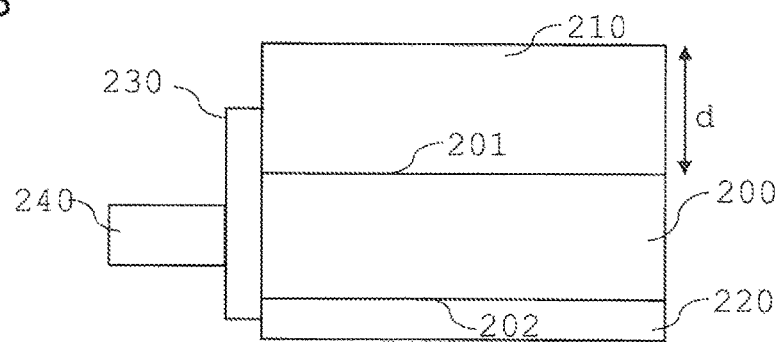
FIG. 2B shows a cross-sectional view of one embodiment of an organic light-emitting diode device.

According to one embodiment, the first hollow space structure includes or is formed from a resilient substance. According to one embodiment, the resilient substance of the first hollow space structure is formed from a transparent material. According to one embodiment, the first hollow space structure has the shape of a hollow cuboid or of a hollow cylinder, or of another suitable hollow space. According to one embodiment, the first hollow space structure includes resilient side walls. The resilient side walls may furthermore also be referred to as a resilient frame or resilient membrane. The modulus of elasticity of the resilient frame is about less than or equal to 1 kN/mm$^2$, for example about less than or equal to 0.5 kN/mm$^2$, for example about less than or equal to 0.1 kN/mm$^2$. One embodiment of a first hollow space 210 having a resilient frame is represented by way of example in FIG. 5, and is described in detail below. The resilient frame is configured in such a way that the resilient frame is expansible when filled with the optically functional liquid so that the volume of the first hollow space 210 increases. The first hollow space 210 has a thickness d, for example as represented in FIG. 2B. The thickness d may be given by the vertical extent of the resilient frame. The resilient frame is configured in such a way that the thickness d of the first hollow space 210 increases when filled with the optically functional liquid, for example as represented in FIG. 2B. According to one embodiment, the resilient frame is configured in such a way that the thickness d of the first hollow space 210 returns approximately to its initial value when the optically functional liquid is removed from the first hollow space 210.

The first hollow space opening and the second hollow space opening are connected to one another by means of the fluid connection 230 in such a way that the optically functional fluid can be moved to and fro between the first hollow space 210 and the second hollow space 220. The fluid connection 230 may, for example, include a valve. According to one embodiment, the fluid connection 230 is configured as a tube or a hose. According to one embodiment, the fluid connection 230 extends along an edge face, connecting the first main surface 201 and the second main surface 202, of the organic light-emitting diode 200.

According to one embodiment, the first hollow space 210 is arranged over the first main surface 201. According to one embodiment, the first hollow space 210 is arranged by means of a holding device over the first main surface 201 and in the beam path of the organic light-emitting diode 200. According to one embodiment, the first hollow space 210 is arranged on the first main surface 201, the first hollow space 210 being for example fastened on the first main surface 201 by means of a connecting means, for example by means of the bonding layer 136. According to one embodiment, the second hollow space 220 is arranged on the second main surface 202, the second hollow space 220 being for example fastened on the second main surface 202 by means of a connecting means, for example by means of an adhesive. According to one embodiment, the first hollow space 210 is integrated into the cover body 138 by the cover body 138 including a recess that can be filled with the optically functional fluid. In the case in which a surface of the carrier 112 forms the first main surface 201, the first hollow space 210 may be integrated into the carrier 112.

According to one embodiment, the first hollow space 210 is formed on the encapsulation 124. Forming the first hollow space 210 on the encapsulation may have the advantage that the organic light-emitting diode device can be configured to be particularly flat, and is therefore particularly versatilely usable. Another advantage may be that the number of further layers, for example of a cover body, between the encapsulation and the first hollow space 210 is reduced. Electromagnetic radiation from the organic light-emitting diode 200 can therefore enter the first hollow space 210 with lower losses, and a particularly efficient and particularly flat organic light-emitting diode device is provided.

The optically functional fluid is formed from or includes an optically functional substance. According to one embodiment, the optically functional fluid is configured as an optically functional liquid. The electromagnetic radiation which is emitted by the organic light-emitting diode 200 is represented by way of example in FIG. 2A by means of the arrow 250, and may furthermore be referred to as the first electromagnetic radiation 250. The optically functional fluid is configured in such a way that at least a part of the first electromagnetic radiation 250 is converted into second electromagnetic radiation 250', for example as represented in FIG. 2A by means of the arrow 250'. For example, the second electromagnetic radiation 250' may have a different propagation direction than the first electromagnetic radiation 250. For example, the second electromagnetic radiation 250' may have a different color locus than the first electromagnetic radiation 250.

The refractive index of the optically functional fluid should be adapted as far as possible to the refractive index of the OLED 200, i.e. for example it should be similar to the refractive index of glass. Liquids having a high refractive index are mentioned below: quinoline has a refractive index of about 1.63; oil, for example cooking oil, has one of from about 1.4 to about 1.6; a concentrated aqueous sugar solution has a refractive index of about 1.5; glycerol has a refractive index of about 1.5; diiodomethane has a refractive index of about 1.74. As an alternative or in addition to a liquid, it is also possible to use a gel, i.e. a viscoelastic fluid, for example a refractive index-matched gel (index matching gel).

According to one embodiment, the control element 240 is configured in such a way that the control element 240 moves the optically functional fluid to and fro between the first hollow space 210 and the second hollow space 220 as a function of an operating voltage of the organic light-emitting diode.

According to one embodiment, the control element 240 is configured in such a way that the control element 240 moves the optically functional fluid from the first hollow space 210 into the second hollow space 220 or from the second hollow space 220 into the first hollow space 210 when a defined operating voltage is fallen below or exceeded.

According to one embodiment, the control element 240 is configured in such a way that it moves the optically functional fluid into the first hollow space 210 when the organic light-emitting diode 200 is switched on, or when the operating voltage is applied to the first electrode 120 and the second electrode 123, and moves the optically functional fluid into the second hollow space 220 when the organic light-emitting diode 200 is switched off.

According to one embodiment, the control element 240 is configured in such a way that the filling level of the optically functional fluid, or the amount of optically functional fluid, in the first hollow space 210 can be adjusted during the operational state of the organic light-emitting diode 200.

According to one embodiment, the control element 240 includes a pump. The optically functional fluid can be moved to and fro between the first hollow space 210 and the second hollow space 220 by means of the pump.

The pump is merely used to move a small volume, the volume depending on the thickness of the first hollow space 210. Accordingly, the pump may be configured to be very small and integrated in the organic light-emitting diode device, for example in a driver housing of the organic light-emitting diode device. The organic light-emitting diode device can therefore be configured to be particularly flat, and is therefore particularly versatilely usable.

According to one embodiment, the pump is configured as a peristaltic pump. According to one embodiment, the pump is configured as a syringe pump.

According to one embodiment, the optically functional fluid is moved to and fro between the first hollow space 210 and the second hollow space 220 by means of electrowetting. According to one embodiment, the first hollow space 210 includes at least one first wetting electrode and/or the second hollow space 220 includes at least one second wetting electrode. According to one embodiment, the control element 240 is configured in such a way that, by means of the control element 240, a first electrical potential can be applied to the at least first wetting electrode and/or a second electrical potential can be applied to the at least second wetting electrode.

According to one embodiment, at least a part of the first hollow space 210 and/or of the second hollow space 220 may include a hydrophobic or hydrophilic coating. In this way, the optically functional fluid can be moved more efficiently to and fro between the hollow spaces 210, 220.

According to one embodiment, the optically functional liquid includes at least one electrolyte, for example a salt. By means of increasing the ion concentration in the optically functional liquid, the optically functional liquid can be moved more efficiently to and fro between the first hollow space 210 and the second hollow space 220.

According to one embodiment, the control element 240 is configured in such a way that the filling level of the optically functional liquid in the first hollow space 210 can be adjusted. The optically functional liquid in the first hollow space 210 may be considered as an optically functional layer. The thickness of the liquid optically functional layer depends on the filling level of the optically functional liquid in the first hollow space 210. According to one embodiment, the optical properties of the liquid optically functional layer depend on its thickness.

According to one embodiment, a refractive index-matched gel is arranged between the first hollow space 210 and the organic light-emitting diode 200. Scattering losses due to refractive index differences at the interface between the first hollow space 210 and the organic light-emitting diode 200 can therefore be reduced.

According to one embodiment, the optically functional fluid includes or is a conversion material, furthermore also referred to as a converter. A liquid conversion material may furthermore also be referred to as a converter liquid. For example, organic converters, organometallic compounds and quantum dots or polycrystalline nanocrystals in solution, since an essentially homogeneous solution or dispersion or suspension is advantageous, may be used as converters. Examples of organic converters are perylenes, fluoresceins, coumarins, rhodamines, stilbenes, porphyrins, phthalocyanines and pyrenes. Conventional inorganic converters are susceptible to being distributed inhomogeneously in liquids. Inorganic converters may form a sediment. It is, however, possible to introduce the activators from the inorganic converters (for example $Ce^{3+}$, $Eu^{2+}$, or other suitable elements) as free ions, hydrated or in similar coordination compounds into solution without their inorganic host lattice. In the case in which the optically functional fluid includes or is a converter, the first hollow space 210 may furthermore also be referred to as a conversion layer. Furthermore, the optically functional liquid in the first hollow space 210 may also be referred to as an optically functional layer, for example as a conversion layer.

During the conversion, excitation radiation is absorbed by the converter and converted into conversion radiation, of which the wavelength and therefore spectral properties and/or color are determined by the conversion properties of the converter. In the embodiments described here, the excitation radiation is radiation emitted by the organic light-emitting diode 200, furthermore also referred to as a pump OLED 200. The excitation radiation may furthermore also be referred to as OLED emission. The conversion radiation may furthermore also be referred to as converter emission.

According to one embodiment, a color-tunable organic light-emitting diode device having a large tuning range, for example monochromatic blue to monochromatic red as well as cold white to warm white, and a neutral nonoperational state is intended to be provided.

The optically functional fluid, for example a solution of an organic converter and a solvent, may be pumped by means of the pump into the first hollow space 210 and pumped out of the first hollow space 210 into the second hollow space 220. The first hollow space 210 may to this end have a variable thickness d. According to one embodiment, the thickness d of the first hollow space 210 is adjustable. A variable thickness d may, for example, be achieved by means of a membrane or a simple rubber seal. When the pump OLED 200 is switched off, the converter liquid may be pumped into the second hollow space 220, furthermore also referred to as a reservoir 220, so that the converter has no effect on the nonoperational state of the OLED 200. In this way, for example, a so-called neutral nonoperational state or a so-called reflective nonoperational state may be produced. During the neutral and the reflective nonoperational states, no operating voltage is applied to the first electrode 120 and the second electrode 123. Furthermore, the beam path of the organic light-emitting diode 200 is free, or at least almost free, from the optically functional fluid during the neutral and the reflective nonoperational states. In the case of a reflective nonoperational state, at least one layer of the OLED 200, for example the cathode, is furthermore configured to be reflective.

The first hollow space 210 may have a thickness of from about 10 nm to about 10 mm, for example from about 1 µm to about 1 mm, for example from about 10 µm to about 100 µm. The reservoir may, for example, be fitted on the rear side of the pump OLED 200. In this way, the organic light-emitting diode device can be configured to be particularly flat. Any desired number of first hollow spaces 210, the thickness d of which is variable, may follow one another.

It has previously been possible to produce color-tunable organic light-emitting diode devices only using elaborate component architectures. Such a component architecture may, for example, employ a structure of individual R, G and B strips, which can be driven individually, so that a variable color mixture is made possible. Another possibility for tunability is offered, for example, by combinations of individually driveable transparent and nontransparent OLEDs, the use of switchable spectral filters and switchable mirrors. Another possibility for producing a so-called Planck wanderer is by means of stacking two OLEDs, one OLED emitting for example warm white light and the other emitting for example cold white light, and controlled electrical driving of the OLEDs. A disadvantage in this case is a relatively elaborate production process, and the required operation of the OLED in AC mode, which has a considerable effect on the aging of the OLED. As an alternative, a system of three different OLEDs may be provided, red, green and blue OLEDs, which are individually driveable and therefore color-controllable, for example in RGB color space. It is likewise known to produce color tunability in RGB color space with the aid of converters applied next to one another. According to one embodiment, the conversion layer is arranged flat over the entire luminous surface, the conversion layer having a variable layer thickness.

It is intended for the proportion of the converted light, and therefore the overall color which results from the excitation radiation of the pump OLED 200 together with the conversion radiation, to be varied by modifying the thickness d of the first hollow space 210 and/or by modifying the filling level of the optically functional liquid in the first hollow space 210. The thickness d of the first hollow space 210 and/or the filling level of the optically functional liquid may be produced by pumping away or in the optically functional liquid in which the converter is dissolved or dispersed, or by stretching or compressing a resilient conversion layer, for example a rubber, as is for example described below in connection with FIG. 6. Optically functional liquids may also be moved with the aid of electric fields, for example by means of electrowetting. The overall color or mixed color, i.e. the color impression of the OLED with converter, is given by the spectrum of the electromagnetic radiation emitted by the pump OLED 200, for example blue light or cold white light, as well as the proportion of the converted light and the spectrum of the conversion radiation. If the thickness d of the first hollow space 210 or the filling level of the optically functional layer in the first hollow space 210 is modified, the proportion of the converted light is modified essentially because of the modified absorbance according to the Beer-Lambert law, and therefore the mixed color is modified. In general, the excitation radiation and the conversion radiation span a gamut. If only one converter substance is used, the gamut is the connecting line between the color locus of the pump OLED 200 and the color locus of the converter in the CIE diagram. By varying the thickness d of the first hollow space 210 and/or by varying the filling level of the optically functional fluid in the first hollow space 210, it is possible to adjust any color locus on the connecting line.

According to one embodiment, the organic light-emitting diode device includes a further optically functional device. The further optically functional device may be configured like an above-described embodiment of the optically functional device. For example, the further optically functional device may likewise include a first hollow space and a second hollow space. According to one embodiment, the first hollow space of the further optically functional device is arranged on or over the first hollow space 210 and in the beam path of the organic light-emitting diode 200.

According to one embodiment, the organic light-emitting diode device includes a first hollow space 210 and a further first hollow space, the further first hollow space being arranged on or over the first hollow space 210. The further first hollow space may be configured according to one embodiment of the first hollow space 210. According to one embodiment, the converter of the first hollow space 210 or the converter of the further first hollow space is configured in such a way that it emits green light. According to one embodiment, the converter of the first hollow space 210 or the converter of the further first hollow space is configured in such a way that it emits red light. According to one embodiment, an OLED 200 which emits blue light is provided. This offers the advantage that it is possible to provide an organic light-emitting diode device by means of which light in a particularly large color space can be generated. In this way, the organic light-emitting diode device is particularly versatilely usable. In particular, the use of two conversion layers, emitting green and red, on a blue OLED is attractive for covering a large RGB color space.

If two conversion layers, each having a variable layer thickness, are arranged over one another, then the OLED emission and the conversion radiations of the two converters span a color triangle. By varying the layer thicknesses of the two conversion layers, it is possible to adjust any color locus within the color triangle. In this way, for example, it is possible to adjust any color in the RGB color space with a blue pump OLED and a green converter and a red converter. In other words, the emission contributions of the pump OLED, of the first conversion layer and of the second conversion layer span a gamut. The ratio of the individual contributions may be varied individually by modifying the layer thicknesses of the first conversion layer and/or of the second conversion layer.

According to one embodiment the organic light-emitting diode 200 emits cold white or neutral white light, for example light having a color temperature of about more than 5000 K (cold white) or about 3300 K to about 5000 K (neutral white). According to one embodiment, the optically functional device is configured in such a way that the cold white or neutral white light emitted by the organic light-emitting diode 200 is at least partially converted in such a way that the sum of converted light and unconverted light gives white light of a lower color temperature, for example warm white light, the warm white light approximately having a color temperature of less than or equal to 3300 K. Furthermore, a conversion layer is arranged in the beam path of the organic light-emitting diode. The converter is used to modify the color temperature of the light emitted by the white OLED. Only a relatively small part of the light that is emitted by the pump OLED 200 is therefore converted. Usually, conversion losses occur during conversion, for example losses in terms of the intensity of the light. If only a small proportion of the light is converted, then the conversion losses may be negligibly small. Furthermore, only a very small amount of conversion material is required for this, for which reason the nonoperational state is scarcely affected. The costs for the conversion material can therefore be kept low.

If the converter or converters is/are in a liquid, the latter may be removed fully or at least almost fully in the nonoperational state so that a neutral nonoperational state or reflective nonoperational state can be achieved. A neutral nonoperational state may be understood as a nonoperational state of the organic light-emitting diode device during which the optics of the organic light-emitting diode device are essentially not influenced by the conversion material or the scattering particles. Furthermore, a reflective nonoperational state may be understood as a nonoperational state, of the organic light-emitting diode device, which is influenced essentially only by the reflective properties of certain layers, for example the cathode, of the organic light-emitting diode. A neutral nonoperational state may be achieved by the converter, which is dissolved or dispersed in a liquid, being pumped from the first hollow space 210 into the second hollow space 220, which forms a reservoir.

One advantage of the embodiments described above is that color tuning of the excitation radiation in a large range, the entire RGB color space, is made possible. In particular, it is possible to produce the color white with different color temperatures. Another advantage is that complicated OLED component architectures, or complicated driver architectures or driving concepts, are not necessary. The conversion layers may be applied directly on the OLED. As an alternative, however, the conversion layers may be spatially separated from the OLED, which may also be referred to as a remote approach.

According to one embodiment, the optically functional fluid includes scattering particles. For example, the scattering particles have a particle size in at least one dimension of from about 1 mm to about 20 nm, for example from about 30 nm to about 50 µm, for example from about 50 nm to about 500 nm. In connection with various embodiments in which the optically functional fluid includes scattering particles, the first hollow space 210 may furthermore also be referred to as a scattering layer. Furthermore, the optically functional liquid in the first hollow space 210 may also be referred to as an optically functional layer, for example as a scattering layer.

The liquid, which for example includes scattering particles, may be pumped into the scattering layer by means of a pump, and pumped back out from the scattering layer. The scattering layer may have a fixed volume or may have a variable thickness. The latter may, for example, be achieved with a membrane or a simple rubber seal. When the OLED 200 is switched off, the liquid may be pumped into the reservoir, so that the scattering layer has no influence on the nonoperational state of the OLED. The scattering layer may, for example, have a thickness of from about 10 nm to about 10 mm, for example from about 300 nm to about 1 mm, for example from about 500 nm to about 100 µm. The reservoir may, for example, be fitted on the rear side of the pump OLED 200, which offers the advantage that a particularly flat organic light-emitting diode device can be provided.

According to one embodiment, the organic light-emitting diode device is intended to be provided having external light extraction by scattering but a neutral nonoperational state, also referred to as a neutral off state. A nonoperational state may refer to any state of an organic light-emitting diode in which the organic light-emitting diode does not emit any electromagnetic radiation. An operational state may refer to any state of an organic light-emitting diode in which the organic light-emitting diode emits electromagnetic radiation.

Various approaches for improving the light extraction are adopted in order to increase the efficiency of OLEDs. These include so-called internal light extraction and so-called external light extraction. Internal light extraction is based on scattering of light in a layer inside an OLED, i.e. in a region between the substrate on one side and the encapsulation or the cover body, also referred to as encapsulation glass, on the other side of the OLED. External light extraction may be carried out with the aid of structures outside the OLED. External light extraction may be achieved by roughening the surface and by external structures, for example microlens arrays or scattering films. A feature common to these methods is that the nonoperational state of the OLED is thereby degraded, i.e. the OLED loses its reflective nonoperational state which represents an essential feature of the OLED.

It is intended for the advantages of a scattering layer, for example the increase in efficiency, in the operational state to be exploited, while at the same time the disadvantage in the nonoperational state is avoided by the scattering layer being on the OLED 200 only during the operational state, so that a neutral or reflective nonoperational state can be made possible. To this end, the scattering layer is produced by a scattering liquid, or a gel. The scattering liquid may, for example, be produced using scattering particles which are dispersed in a liquid. The scattering layer is pumped when switching on the OLED into a reservoir above the OLED, which is pumped empty again when switching off. The reservoir may have a fixed volume, for example being produced using a cavity in a glass, or alternatively it may also be produced using a membrane.

One advantage is that use of external light extraction is particularly efficient and leads to a longer lifetime for the same luminance of the OLED, while at the same time a neutral nonoperational state is achieved by removing the scattering layer in the nonoperational state.

Liquids may also be moved with the aid of electric fields for example by means of electrowetting.

The present disclosure is particularly suitable for lighting applications in which the OLEDs are oriented horizontally, since in this way a homogeneous distribution of the scattering particles above the luminous surface can be ensured very simply.

Figure 2C:
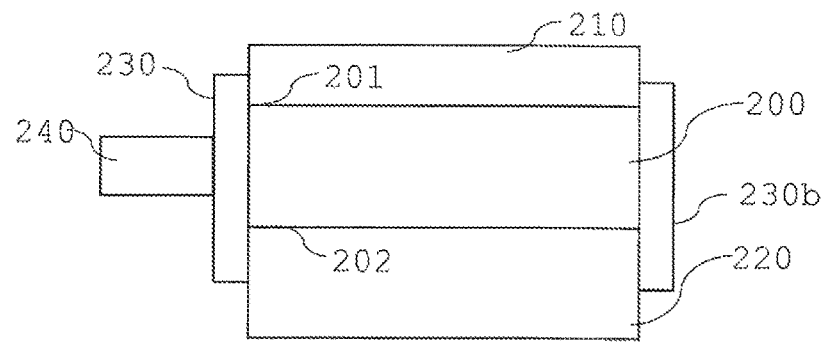
FIG. 2C shows a cross-sectional view of one embodiment of an organic light-emitting diode device.

FIG. 2C shows one embodiment of the organic light-emitting diode device, which, for example, may correspond substantially to the embodiment shown in FIG. 2A.

The organic light-emitting diode device shown in FIG. 2C includes a second fluid connection 230b.

According to one embodiment, the first hollow space 210 includes a further first hollow space opening and the second hollow space 220 includes a further second hollow space opening. The second fluid connection 230b connects the further first hollow space opening to the further second hollow space opening. The first hollow space opening and the further first hollow space opening are arranged with respect to one another in such a way that, for example, the first hollow space opening is used as an inlet or outlet and the further first hollow space opening, in accordance with the first hollow space opening, is used as an outlet or inlet. The first hollow space opening and the further first hollow space opening are arranged, for example, on two mutually opposite side surfaces of the first hollow space 210. In a similar way, the second hollow space opening and the further second hollow space opening are arranged with respect to one another in such a way that, for example, the second hollow space opening is used as an inlet or outlet and the further second hollow space opening, in accordance with the second hollow space opening, is used as an outlet or inlet. The second hollow space opening and the further second hollow space opening are arranged, for example, on two mutually opposite side surfaces of the second hollow space 220.

The optically functional fluid includes a first solvent and a second solvent, the first solvent and the second solvent essentially being immiscible with one another.

Two liquids may be considered to be essentially immiscible with one another when the solubility of one liquid in the other liquid is less than about 10 g/l, for example about less than 5 g/l, for example less than 1 g/l.

The first solvent may, for example, be toluene and the second solvent may, for example, be water, toluene having a solubility of about 0.5 g/l in water. The first solvent may, for example, be xylene and the second solvent may, for example, be water, xylene having a solubility of about 0.2 g/l in water. The first solvent may, for example, be cyclohexane and the second solvent may, for example, be water, cyclohexane having a solubility of about 0.05 g/l in water.

As an alternative to water, the second solvent may be a substance or a plurality of substances from the group of alcohols, for example ethanol, for example isopropanol, for example glycerol.

The first solvent may be a nonpolar solvent or a plurality of nonpolar solvents. A nonpolar solvent may, for example, be a substance from the group of alkanes. A nonpolar solvent may, for example, be a substance from the group of carbonyls. A nonpolar solvent may, for example, be a substance from the group of oils.

The first solvent may be a liquid which includes an optically functional substance, for example scattering particles and/or a conversion material.

The second solvent may be a liquid which is free from an optically functional substance, for example free from scattering particles and/or a conversion material. The second solvent may be a colorless liquid, for example water.

The control element 240 is configured to move the first solvent to and fro between the first hollow space 210 and the second hollow space 220, and in accordance therewith to move the second solvent to and fro between the second hollow space 220 and the first hollow space 210.

By means of the embodiment described above, it is possible to move the first solvent into the first hollow space 210 while the second solvent is moved into the second hollow space 220. Conversely, the first solvent can also be moved into the second hollow space 220 while the second solvent is moved into the first hollow space 210. By means of the second solvent, which is immiscible with the first solvent, for example, the first solvent can be removed almost without residue from the first hollow space.

According to one embodiment, the control element 240 includes the pump described above, the pump being connected for example to the fluid connection 230. The fluid connection 230 may, for example, be configured as a hose which is clamped in a peristaltic pump.

Figure 3A:
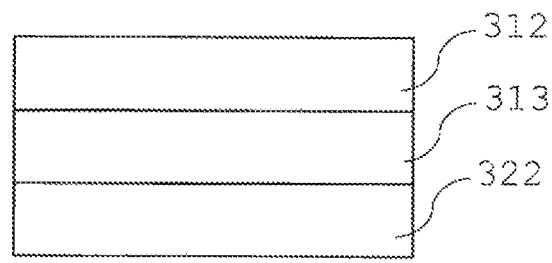
FIG. 3A shows a cross-sectional view of an organic light-emitting diode device.
Figure 3B:
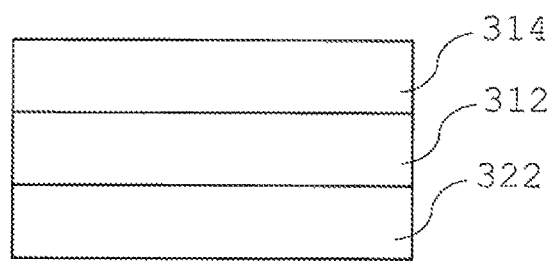
FIG. 3B shows a cross-sectional view of an organic light-emitting diode device.
Figure 3C:
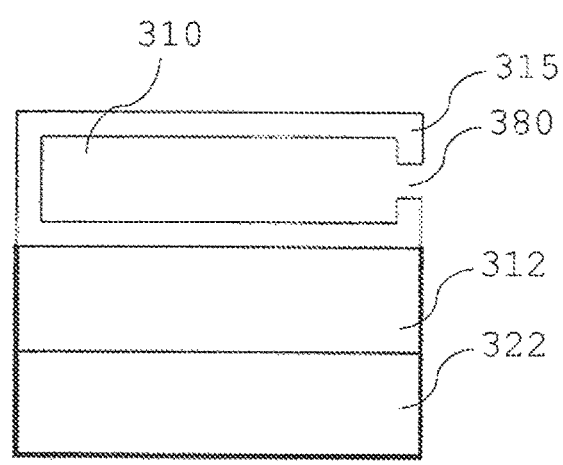
FIG. 3C shows a cross-sectional view of one embodiment of an organic light-emitting diode device.

FIG. 3A shows an organic light-emitting diode device which includes an internal light extraction device. FIG. 3B shows an organic light-emitting diode device which includes an external light extraction device. FIG. 3C shows an organic light-emitting diode device according to an embodiment which corresponds substantially to the embodiment shown in FIG. 2A.

The organic light-emitting diode device shown in FIG. 3A includes an organic functional layer structure 322. The organic functional layer structure 322 approximately has a refractive index of 1.7. The internal light extraction device 313 is arranged on or over the organic functional layer structure 322. A carrier 312 is arranged on or over the internal light extraction device 313. The carrier 312 has a refractive index of about 1.5. The internal light extraction device is used for internal light extraction, which includes the extraction of substrate modes and organic modes, an OLED with internal light extraction having the same appearance in the nonoperational state as in the operational state.

The organic light-emitting diode device shown in FIG. 3B includes an organic functional layer structure 322. The organic functional layer structure 322 approximately has a refractive index of 1.7. The carrier 312 is arranged on or over the organic functional layer structure 322. The external light extraction device 314, for example a scattering device, is arranged on or over the carrier 312. The external light extraction device is used for external light extraction, which includes the extraction of substrate modes, an OLED with external light extraction having the same appearance in the nonoperational state as in the operational state.

The organic light-emitting diode device shown in FIG. 3C includes an organic functional layer structure 322. The carrier 312 is arranged on or over the organic functional layer structure 322. There is a first hollow space 310, and a structure 315 enclosing the first hollow space 310, on or over the carrier 312. The first hollow space 310 includes a first hollow space opening 380. The first hollow space 310 is connected by means of the first hollow space opening 380 to the second hollow space (not represented). The first hollow space 310 is configured according to an above-described embodiment of the first hollow space 210. The structure 315 enclosing the first hollow space 310 may furthermore also be referred to as the cavity 315. The refractive index of the cavity 315 is matched to the refractive index of the carrier 312, for example by the refractive index of the cavity 315 having approximately the same value as the refractive index of the carrier 312. For example, the refractive index of the cavity 315 is about 1.4 to about 2, for example about 1.5 to about 1.8.

The organic functional layer structures 322 shown in FIG. 3A, FIG. 3B and FIG. 3C are configured according to one embodiment of the organic functional layer structure 122 described above.

It should be noted that the organic light-emitting diodes represented in FIG. 3A, FIG. 3B and FIG. 3C are configured in a bottom emitter architecture of the organic light-emitting diode 200. The considerations described above likewise apply similarly, if logically applicable, for a top emitter architecture of the organic light-emitting diode 200.

The internal light extraction includes the extraction of substrate modes and organic modes, an organic light-emitting diode with internal light extraction, for example with an internal light extraction device 313, having the same appearance in the nonoperational state as in the operational state. The external light extraction includes the extraction of substrate modes, the organic light-emitting diode with internal light extraction, for example with an external light extraction device 314, having the same appearance in the nonoperational state as in the operational state. However, a method for producing an organic light-emitting diode with an external light extraction device 314 is usually simpler and better established than a method for producing an organic light-emitting diode with an internal light extraction device. The production of an organic light-emitting diode device with an optically functional device or resiliently optically functional layer has comparable advantages to the method for producing an OLED with external light extraction external extraction. Another advantage, however, results from the fact that an OLED with a resiliently optically functional layer and/or an optically functional device can be used particularly versatilely, since for example a neutral nonoperational state can be achieved. The improvement in efficiency by using the liquid scattering layer is comparable to the approach of external extraction. The efficiency is, however, dependent on the refractive index of the substrate and of the material for the cavity in which the scattering liquid is contained. In the simplest case, this material is the same as the substrate material, for example glass. The approach is comparable to internal extraction, with the difference that in general only the substrate modes are extracted, if the refractive index of the substrate material and of the cavity material is less than the refractive index of the organics, although in return a reflective nonoperational state can be produced.

The liquid, which for example includes scattering particles, may be pumped into the scattering layer by means of a pump, and pumped back out from the scattering layer. The scattering layer may have a fixed volume or may have a variable thickness. The latter may, for example, be achieved with a membrane or a simple rubber seal. When the OLED is switched off, the liquid may be pumped into the reservoir, so that the scattering layer has no influence on the nonoperational state of the OLED. The reservoir may, for example, be fitted on the rear side of the pump OLED, which offers the advantage that the area of the organic light-emitting diode device is approximately the area of the luminous surface, and the organic light-emitting diode device is therefore not unnecessarily enlarged. A luminous surface of the organic light-emitting diode may refer to any surface which provides electromagnetic radiation to a region external to the light-emitting diode. The optically active region of the organic light-emitting diode may, for example, be referred to as a luminous surface.

Figure 4:
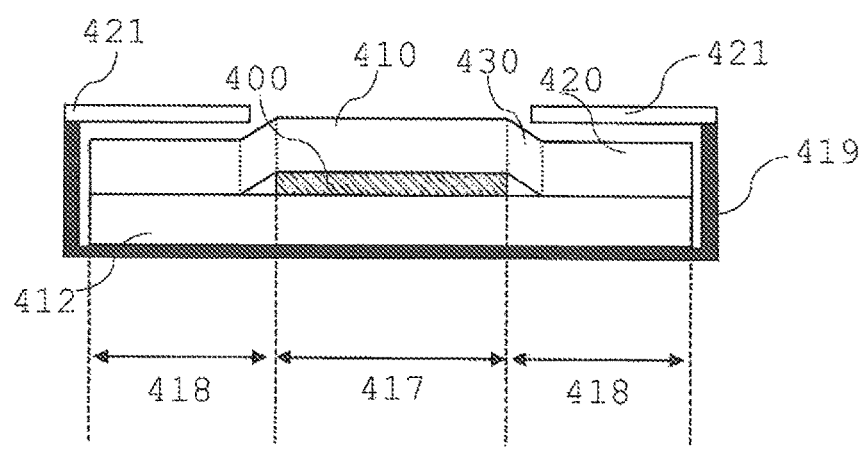
FIG. 4 shows a cross-sectional view of one embodiment of an organic light-emitting diode device.

FIG. 4 shows an embodiment of the organic light-emitting diode device which may for example correspond substantially to the embodiment shown in FIG. 2. The organic light-emitting diode device includes an organic light-emitting diode 400 and a carrier 412 having an optically active region 417 and an optically inactive region 418 arranged next to the optically active region 417, and it also includes an optically functional device having a first hollow space 410 and a second hollow space 420. The organic light-emitting diode device furthermore includes a housing element 421 in the optically inactive region 418 and a control element (not represented). The first hollow space 410 and the second hollow space 420 are connected to one another by means of a fluid connection 430. The organic light-emitting diode 400 is formed in the optically active region 417. The first hollow space 410 is formed on or over the organic light-emitting diode 400 and in the optically active region 417. The second hollow space 420 is formed on or over the carrier 412 and between the carrier 412 and the housing element 421 in the optically inactive region 418. An optically functional fluid is arranged in the optically functional device. The control element is configured to move the optically functional fluid to and fro between the first hollow space and the second hollow space.

The organic light-emitting diode 400 is configured according to an above-described embodiment of the organic light-emitting diode 100.

The optically active region 417 is that region of the organic light-emitting diode device which can emit electromagnetic radiation, for example light, by means of a voltage applied to the optically active region, for example the operating voltage. The optically active region 417 includes a first electrode, a second electrode, and an organic functional layer structure arranged between them.

The control element is configured according to an above-described embodiment of the control element 240.

The carrier 412 is configured according to an above-described embodiment of the carrier 112.

In FIG. 4, the boundary between the second hollow space 420 and the fluid connection 430 and the boundary between the fluid connection 430 and the first hollow space 410 are represented by means of a dotted line. The first hollow space 410, the second hollow space 420 and the fluid connection 430 are arranged on or over the carrier 412. The first hollow space 410 may be configured according to an above-described embodiment of the first hollow space 210. The second hollow space 420 may be configured according to an above-described embodiment of the second hollow space 220. The fluid connection 430 may be configured according to an above-described embodiment of the fluid connection 230.

According to one embodiment, the housing element 421 is part of a housing 419. The carrier 412 with the organic light-emitting diode 400 is arranged in the housing. The housing may be used for the organic light-emitting diode 400 as protection against external influences, for example moisture or the effect of mechanical force. The housing 419 at least partially encloses the carrier 412 together with the organic light-emitting diode 400. The housing element 421 is arranged in the optically inactive region in such a way that the second hollow space 420 is at least partially covered by the housing element 421. In this way, the second hollow space 420 is protected against external influences by means of the housing element 421, and the organic light-emitting diode device can be used particularly versatilely.

The optically functional fluid may be configured according to one embodiment of the optically functional fluid described above.

According to one embodiment, a refractive index-matched gel is arranged between the first hollow space 410 and the organic light-emitting diode 400. In this way, scattering losses due to refractive index differences at the interface between the first hollow space 410 and the organic light-emitting diode 400 can be reduced.

Figure 5:
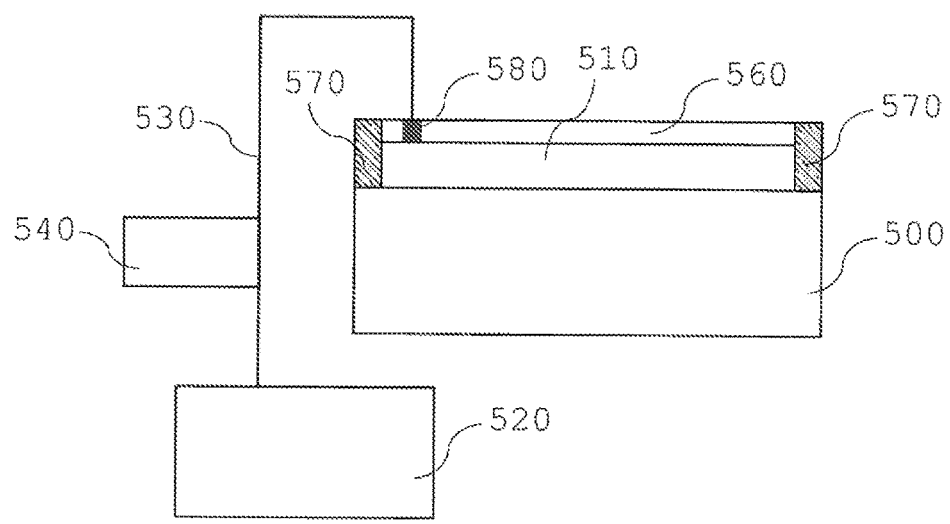
FIG. 5 shows a cross-sectional view of one embodiment of an organic light-emitting diode device.

FIG. 5 shows one embodiment of the organic light-emitting diode device, which may for example correspond substantially to the embodiment shown in FIG. 4.

The organic light-emitting diode device includes an organic light-emitting diode 500, an optically functional device and a control element 540, the optically functional device including a nonresilient cover body 560 arranged in the beam path of the organic light-emitting diode 500 and a resilient frame 570. The nonresilient cover body 560 and the resilient frame 570 form a first hollow space 510. The control element 540 is configured to vary the volume of the first hollow space 510 with deformation of the resilient frame 570.

The organic light-emitting diode 500 is configured according to an above-described embodiment of the organic light-emitting diode 100, 200, 300, 400.

According to one embodiment, the resilient frame 570 has a modulus of elasticity of about less than or equal to 1 kN/mm$^2$, for example about less than or equal to 0.5 kN/mm$^2$, for example about less than or equal to 0.1 kN/mm$^2$.

According to one embodiment, the optically functional device furthermore includes a second hollow space 520 outside the beam path of the organic light-emitting diode 500, and an optically functional fluid is arranged in the optically functional device.

According to one embodiment, the nonresilient cover body 560 is for example made of glass or plastics such as PMMA (polymethyl methacrylate), PC (polycarbonates), PVC (polyvinyl chloride), or includes a glass or at least one of the aforementioned plastics. The nonresilient cover body 560 may furthermore be configured to be transparent or translucent. According to one embodiment, the nonresilient cover body 560 includes a hollow space opening 580. The hollow space opening of the nonresilient cover body may be configured like the hollow space opening 380 described above. According to one embodiment, the hollow space opening 580 is formed in an optically inactive region of the organic light-emitting diode device. According to one embodiment, the organic light-emitting diode device includes a fluid connection 530, in which case the fluid connection 530 may be configured like the fluid connection 230, 430 described above. According to one embodiment, the hollow space opening 580 is connected to the fluid connection 530. According to one embodiment, the first hollow space 520 is connected to the second hollow space 520 by means of the hollow space opening 580 and the fluid connection 530.

According to one embodiment, the resilient frame 570 is fastened, for example adhesively bonded, onto the edges of the nonresilient cover body 560.

According to one embodiment, the first hollow space 510 is arranged on the organic light-emitting diode 500, for example by the resilient frame 570 being arranged on the cover body of the organic light-emitting diode 500, if present. The cover body of the organic light-emitting diode 500 may be configured according to an above-described embodiment of the cover body 138. The cover body, or at least a region of the cover body, in this case forms the lower boundary of the first hollow space 510. The upper boundary, or at least a region of the nonresilient cover body 560, forms the upper boundary of the first hollow space 510. The lateral boundary of the first hollow space 510 is formed by the resilient frame 570.

The control element 540 is configured according to an above-described embodiment of the control element 240.

The optically functional fluid is configured according to an above-described embodiment of the optically functional fluid.

According to one embodiment, a refractive index-matched gel is arranged between the first hollow space 510 and the organic light-emitting diode 500. In this way, scattering losses due to refractive index differences at the interface between the first hollow space 510 and the organic light-emitting diode 500 can be reduced.

Figure 6:
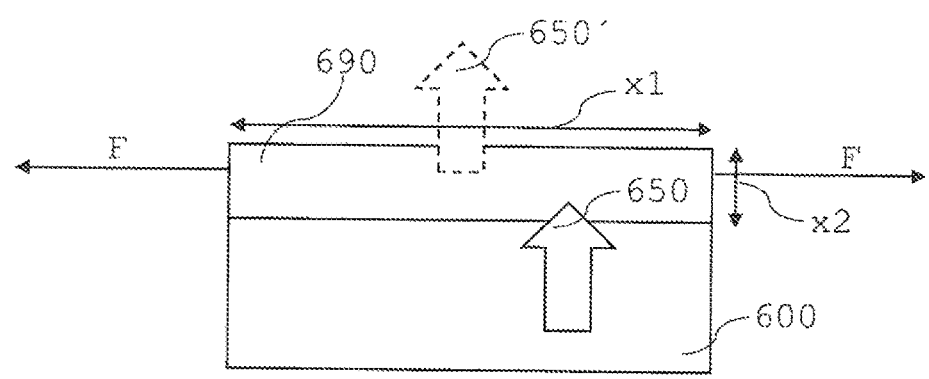
FIG. 6 shows a cross-sectional view of one embodiment of an organic light-emitting diode device.

FIG. 6 shows one embodiment of the organic light-emitting diode device, which may for example correspond substantially to the embodiment shown in FIG. 5. The organic light-emitting diode device includes an organic light-emitting diode 600 and a resilient optically functional layer 690, the resilient optically functional layer 690 having a first extent x1 along a first direction and a second extent x2 along a second direction. The resilient optically functional layer 690 is arranged in the beam path of the organic light-emitting diode 600. The second direction is perpendicular to the first direction. The resilient optically functional layer 690 is configured to reduce the second extent x2 in the event of an increase in the first extent x1.

The organic light-emitting diode 600 is configured according to an above-described embodiment of the organic light-emitting diode 100, 200, 300, 400, 500.

According to one embodiment, the resilient optically functional layer 690 may be arranged on or over the organic light-emitting diode 600, for example as is described in detail above in connection with the first hollow space 210.

According to one embodiment, the resilient optically functional layer 690 is held in the beam path of the organic light-emitting diode 600 by means of a holding device. According to one embodiment, the resilient optically functional layer 690 is fitted on the organic light-emitting diode 600, as is described in detail above in connection with the first hollow space 210.

The resilient optically functional layer 690 may have the shape of a cuboid, of a cylinder and/or any other desired suitable shape. If the resilient optically functional layer 690 has the shape of a cuboid, for example, then the cuboid has a length, a width and a height. The length, the width and the height of the cuboid respectively extend along directions, these directions being perpendicular to one another. The length of the resilient optically functional layer 690 may be regarded as the first extent x1. Furthermore, the height of the resilient optically functional layer 690 may be regarded as the second extent x2. The height of the resilient optically functional layer 690 may also be referred to below as the thickness of the resilient optically functional layer 690. The width of the resilient optically functional layer 690 may be regarded as a third extent. In order to modify, for example to reduce, the thickness of the resilient optically functional layer 690, a force F, for example a tensile force, may be exerted on the resilient optically functional layer 690 in such a way that the length and/or the width of the resilient optically functional layer 690 are/is modified, for example increased. In general, if a tensile force is exerted on the resilient optically functional layer 690 in one direction, then the resilient optically functional layer 690 will be enlarged in this direction and made smaller in the other two respective directions.

According to one embodiment, the resilient optically functional layer 690 is arranged flat on or over the organic light-emitting diode 600. According to one embodiment, the resilient optically functional layer 690 is arranged on or over the organic light-emitting diode 600 in such a way that almost all of the electromagnetic radiation 650 which is emitted by the organic light-emitting diode is emitted into the resilient optically functional layer 690.

The second extent x2 may also be referred to below as the thickness or layer thickness of the resilient optically functional layer.

According to one embodiment, the resilient functional layer 690 includes or is formed from a resilient polymer. According to one embodiment, the resilient functional layer 690 includes or is formed from a conversion material. The resilient optically functional layer 690 may furthermore also as a resilient conversion layer, if the resilient optically functional layer 690 includes a conversion material.

The thickness d of the resilient conversion layer may be modified by means of the force F, for example by means of pulling or pushing with the force F. In order to tune the color, the extension of the conversion layer is modified. Compression back into an initial state after stretching is ensured by a restoring force of the resilient conversion layer, for example of the resilient rubber layer. Any desired number of resilient conversion layers, the layer thickness of which is variable, may follow one another. Resilient conversion layers and conversion layers having an optically functional fluid may also follow one another.

According to one embodiment, a refractive index-matched gel is arranged between the resilient optically functional layer 690 and the organic light-emitting diode 600. In this way, scattering losses due to refractive index differences at the interface between the resilient optically functional layer 690 and the organic light-emitting diode 600 can be reduced.

Figure 7:
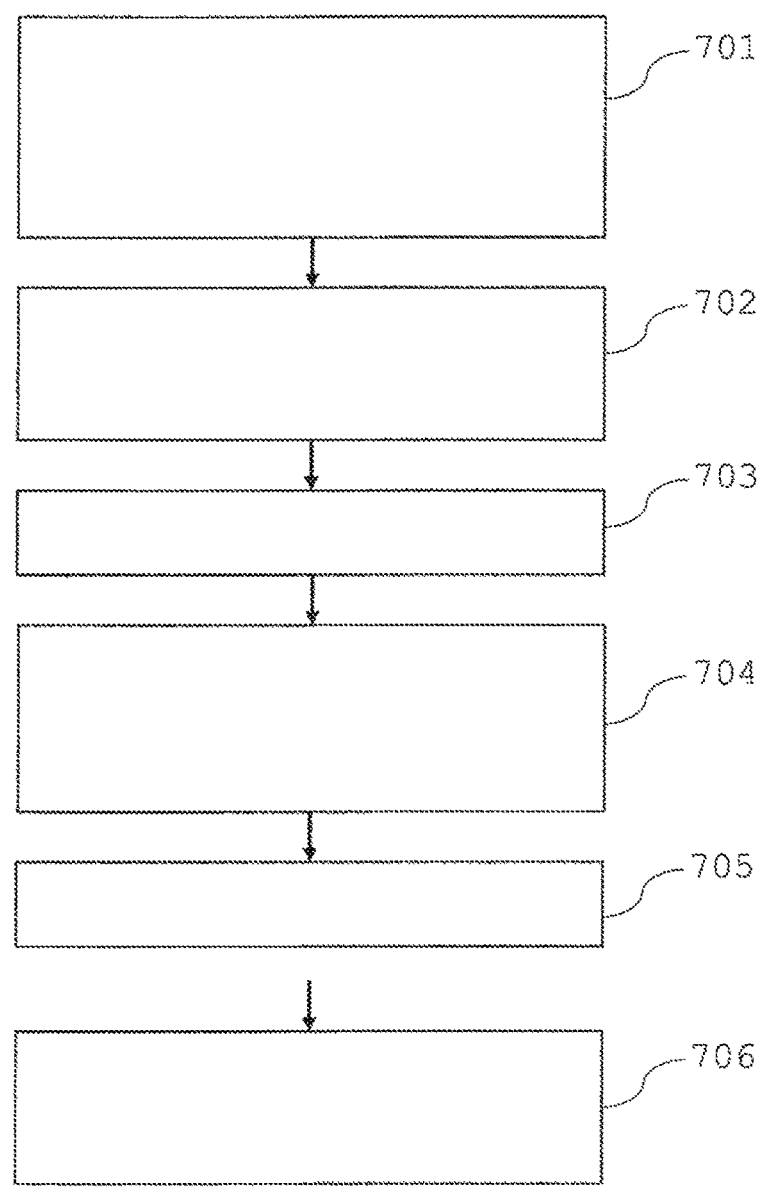
FIG. 7 shows a flow chart of a method for producing one embodiment of an organic light-emitting diode device.

FIG. 7 shows a flow chart of a method for producing an organic light-emitting diode device, which is shown for example in FIG. 2A, FIG. 2B, FIG. 2C and FIG. 3C.

The method for producing an organic light-emitting diode device includes formation 701 of an organic light-emitting diode having a first main surface and a second main surface lying opposite the first main surface. The method furthermore includes the formation 702 of an optically functional device having a first hollow space and a second hollow space. The method furthermore includes provision 703 of a control element. The method furthermore includes arrangement 704 of the first hollow space on or over the first main surface and of the second hollow space below the second main surface. The method furthermore includes connection 705 of the first hollow space to the second hollow space. The method furthermore includes arrangement 706 of an optically functional fluid in the optically functional device. The control element is configured to move the optically functional fluid to and fro between the first hollow space and the second hollow space.

According to one embodiment, the organic light-emitting diode is configured according to an above-described embodiment of the organic light-emitting diode 200. According to one embodiment, the optically functional device is configured according to an above-described embodiment of the optically functional device.

According to one embodiment, the organic light-emitting diode is configured including encapsulation and the first hollow space is formed on the encapsulation. According to one embodiment, the encapsulation is configured according to an above-described embodiment of the encapsulation 124.

According to one embodiment, the first hollow space is configured including at least one first wetting electrode and/or the second hollow space is configured including at least one second wetting electrode. The first wetting electrode is configured according to an above-described embodiment of the first wetting electrode. The second wetting electrode is configured according to an above-described embodiment of the second wetting electrode.

According to one embodiment, the control element is configured in such a way that, by means of the control element, a first electrical potential can be applied to the at least first wetting electrode and/or a second electrical potential can be applied to the at least second wetting electrode. The control element is formed, arranged and/or configured according to an above-described embodiment of the control element.

According to one embodiment, the control element is configured to move the optically functional fluid to and fro between the first hollow space and the second hollow space as a function of an operating voltage of the organic light-emitting diode. According to one embodiment, the control element 240 is configured in such a way that the control element 240 moves the optically functional fluid from the first hollow space 210 into the second hollow space 220 or from the second hollow space 220 into the first hollow space 210 when a defined operating voltage is fallen below or exceeded. According to one embodiment, the control element 240 is configured in such a way that it moves the optically functional fluid into the first hollow space 210 when the organic light-emitting diode 200 is switched on, or when the operating voltage is applied to the first electrode 120 and the second electrode 123, and moves the optically functional fluid into the second hollow space 220 when the organic light-emitting diode 200 is switched off. According to one embodiment, the control element 240 is configured in such a way that the filling level of the optically functional fluid, or the amount of optically functional fluid, in the first hollow space 210 can be adjusted during the operational state of the organic light-emitting diode 200.

In 705, the first hollow space 210 is connected to the second hollow space 220. The connection 705 of the first hollow space 210 to the second hollow space 210 may be carried out by means of the fluid connection 230 and/or the second fluid connection 230b.

According to one embodiment, the arrangement 706 of the optically functional fluid in the optically functional device includes matching of the refractive index of the optically functional fluid to the refractive index of the organic light-emitting diode 200. Examples of liquids having a high refractive index are specified above in the description. According to one embodiment, the optically functional fluid is configured including scattering particles. According to one embodiment, the optically functional fluid is configured including a conversion material.

The arrangement 706 of the optically functional fluid may include arrangement of the first solvent and of the second solvent in the optically functional device. For example, the first solvent is arranged in the first hollow space 210 and in the fluid connection 230, and the second solvent is arranged in the second hollow space 220 and in the second fluid connection 230b. For example, the second solvent is arranged in the first hollow space 210 and in the fluid connection 230, and the first solvent is arranged in the second hollow space 220 and in the second fluid connection 230b. For example, the first solvent is arranged in the first hollow space 210 in addition to the second solvent, in such a way that the first solvent is arranged over a first subregion of the first main surface 201 and the second solvent is arranged over a second subregion of the first main surface 201. For example, the first solvent is arranged in the second hollow space 220 in addition to the second solvent, in such a way that the first solvent is arranged over a first subregion of the second main surface 202 and the second solvent is arranged over a second subregion of the second main surface 202.

This makes it possible for a force, which is for example exerted on the first solvent by means of the pump and leads to the first solvent being moved for example from the first hollow space 210 into the second hollow space 220, to act on the second solvent through the first solvent and, in a manner corresponding thereto, to move the second solvent from the second hollow space 220 into the first hollow space 210.

The control element may be configured according to one embodiment of the control element 240 described above. According to one embodiment, the control element is configured including a pump.

According to one embodiment, the organic light-emitting diode device is configured including a further optically functional device. The further optically functional device may be configured like an above-described embodiment of the optically functional device. For example, the further optically functional device may likewise be configured including a first hollow space and a second hollow space. According to one embodiment, the first hollow space of the further optically functional device is arranged on or over the first hollow space 210 and in the beam path of the organic light-emitting diode 200. According to one embodiment, the organic light-emitting diode device is configured including a first hollow space 210 and a further first hollow space, the further first hollow space being arranged on or over the first hollow space 210. The further first hollow space may be configured according to one embodiment of the first hollow space 210. The further first hollow space is configured according to an embodiment, described in detail above, of the further first hollow space.

According to one embodiment, a refractive index-matched gel is arranged between the first hollow space 210 and the organic light-emitting diode 200.

Figure 8:
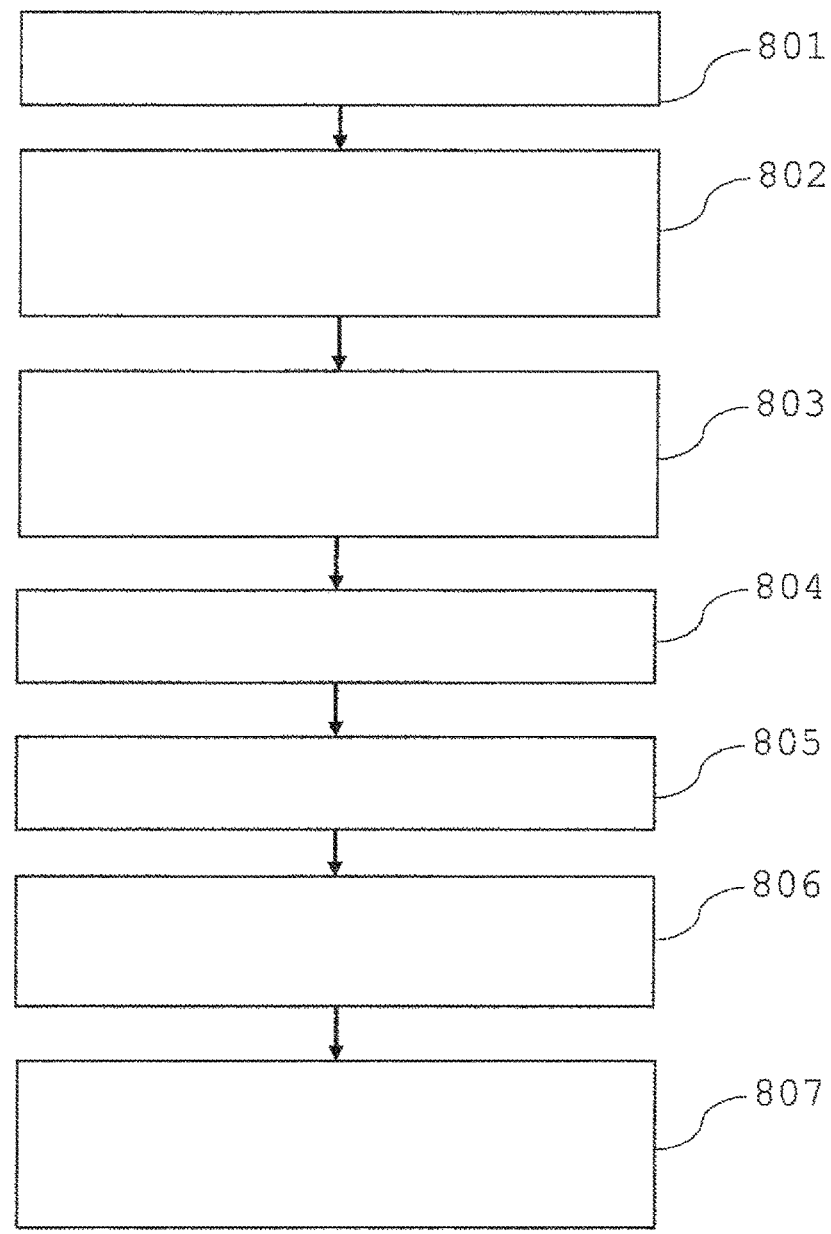
FIG. 8 shows a flow chart of a method for producing one embodiment of an organic light-emitting diode device.

FIG. 8 shows a flow chart of a method for producing an organic light-emitting diode device, which is shown for example in FIG. 4.

The method for producing an organic light-emitting diode device includes formation 801 of an organic light-emitting diode 400. The method furthermore includes provision 802 of a carrier 412 having an optically active region 417 and an optically inactive region 418 arranged next to the optically active region 417. The method furthermore includes the formation 803 of an optically functional device having a first hollow space 410 and a second hollow space 420. The method furthermore includes arrangement 804 of a housing element 421 in the optically inactive region 418. The method furthermore includes provision 805 of a control element. The method furthermore includes the connection 806 of the first hollow space 410 to the second hollow space 420 by means of a fluid connection 430. The organic light-emitting diode 400 is formed in the optically active region 417. The first hollow space 410 is formed on or over the organic light-emitting diode 400 and in the optically active region 417. The second hollow space 420 is formed on or over the carrier 412 and between the carrier and the housing element 421 in the optically inactive region 418. The method furthermore includes arrangement of an optically functional fluid in the optically functional device. The control element is configured to move the optically functional fluid to and fro between the first hollow space 410 and the second hollow space 420.

According to one embodiment, the organic light-emitting diode 400 is configured according to an above-described embodiment of the organic light-emitting diode 400. According to one embodiment, the optically functional device is configured according to an above-described embodiment of the optically functional device.

According to one embodiment, the organic light-emitting diode 400 is configured including encapsulation and the first hollow space 410 is formed on the encapsulation. The encapsulation is configured according to an above-described embodiment of the encapsulation 124.

According to one embodiment, the first hollow space 410 is configured including at least one first wetting electrode and/or the second hollow space is configured including at least one second wetting electrode. The first wetting electrode is configured according to an above-described embodiment of the first wetting electrode. The second wetting electrode is configured according to an above-described embodiment of the second wetting electrode.

According to one embodiment, the control element is configured in such a way that, by means of the control element, a first electrical potential can be applied to the at least first wetting electrode and/or a second electrical potential can be applied to the at least second wetting electrode. According to one embodiment, the control element is configured to move the optically functional fluid to and fro between the first hollow space 410 and the second hollow space 420 as a function of an operating voltage of the organic light-emitting diode. The control element is formed, arranged and/or configured according to an above-described embodiment of the control element. According to one embodiment, the control element is configured including a pump.

The optically active region 417 is configured like the above-described optically active region 417. The optically inactive region 418 is configured like the above-described optically inactive region 418.

The carrier 412 is configured according to an above-described embodiment of the carrier 112.

The housing element 421 is configured according to one embodiment of the housing element 421 described above. According to one embodiment, a housing 419 is formed, the housing 419 being configured as including the housing element 421. The carrier 412 with the organic light-emitting diode 400 is arranged in the housing 419.

The optically functional fluid is configured according to one embodiment of the optically functional fluid described above. According to one embodiment, the optically functional fluid is configured including scattering particles. According to one embodiment, the optically functional fluid is configured including a conversion material.

According to one embodiment, a refractive index-matched gel is arranged between the first hollow space 410 and the organic light-emitting diode 400.

Figure 9:
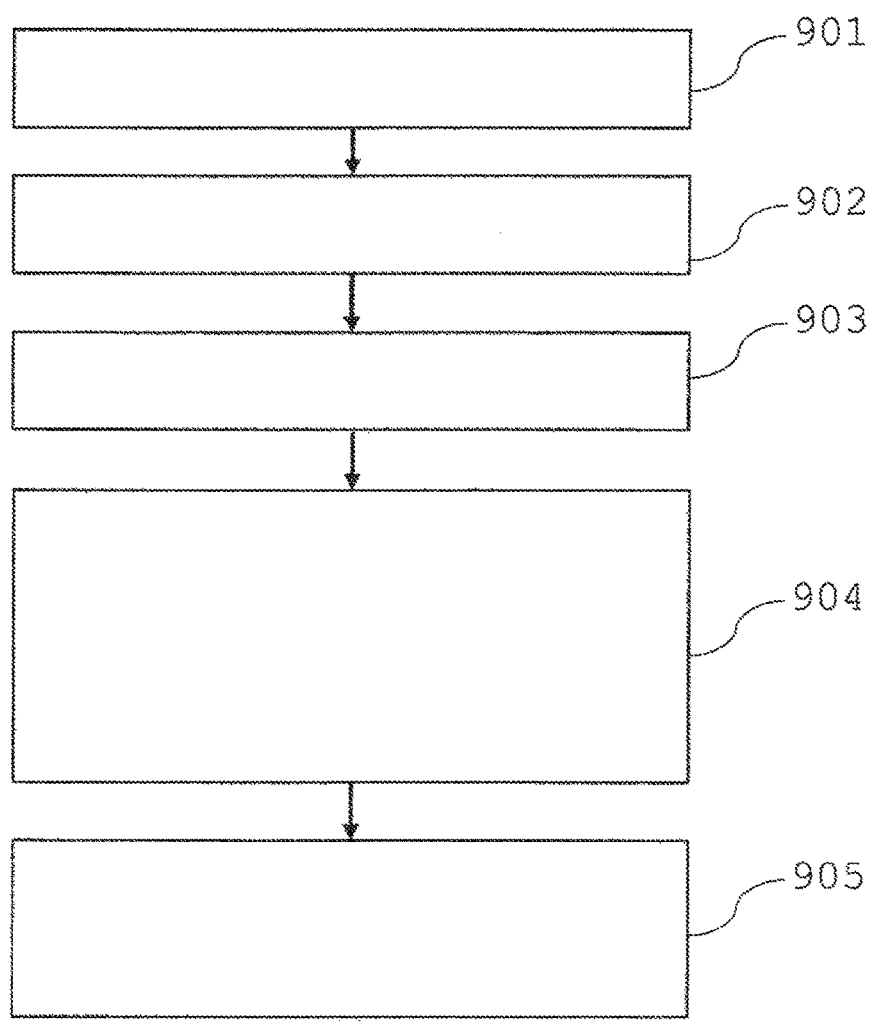
FIG. 9 shows a flow chart of a method for producing one embodiment of an organic light-emitting diode device.

FIG. 9 shows a flow chart of a method for producing an organic light-emitting diode device, which is shown for example in FIG. 5.

The method for producing an organic light-emitting diode device includes formation 901 of an organic light-emitting diode 500. The method furthermore includes formation 902 of an optically functional device. The method furthermore includes provision 903 of a control element 540. The optically functional device is configured including a nonresilient cover body 560 arranged in the beam path of the organic light-emitting diode 500 and a resilient frame 570. The nonresilient cover body 560 and the resilient frame 570 form a first hollow space 510. The control element 540 is configured to vary the volume of the first hollow space 510 by deformation of the resilient frame 570.

According to one embodiment, the resilient frame 570 is configured having a modulus of elasticity of about less than or equal to 1 kN/mm$^2$, for example about less than or equal to 0.5 kN/mm$^2$, for example about less than or equal to 0.1 kN/mm$^2$. The resilient frame 570 is configured according to an above-described embodiment of the resilient frame 570.

According to one embodiment, the optically functional device is furthermore configured including a second hollow space 520 outside the beam path of the organic light-emitting diode 500, and an optically functional fluid is arranged in the optically functional device. The optically functional device is configured according to an above-described embodiment of the optically functional device.

According to one embodiment, the control element 540 is configured including a pump.

According to one embodiment, the optically functional fluid is configured including scattering particles.

According to one embodiment, the optically functional fluid is configured including a conversion material.

The organic light-emitting diode 500 is configured according to an above-described embodiment of the organic light-emitting diode 500.

The nonresilient cover body 560 is configured according to an above-described embodiment of the nonresilient cover body 560.

The resilient frame 570 is configured according to an above-described embodiment of the resilient frame 570.

The first hollow space 510 is configured according to an above-described embodiment of the first hollow space 510.

The control element 540 is formed, arranged and/or configured according to an above-described embodiment of the control element 540.

The optically functional fluid is configured according to an above-described embodiment of the optically functional fluid.

According to one embodiment, a refractive index-matched gel is arranged between the first hollow space 510 and the organic light-emitting diode 500.

Figure 10:
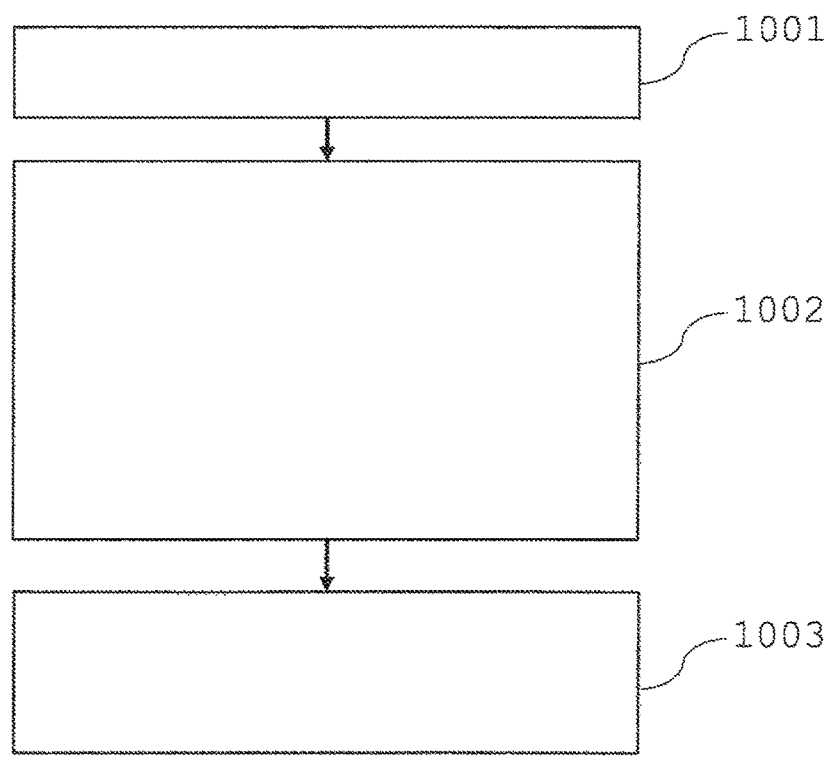
FIG. 10 shows a flow chart of a method for producing one embodiment of an organic light-emitting diode device.

FIG. 10 shows a flow chart of a method for producing an organic light-emitting diode device, which is shown for example in FIG. 6.

The method for producing an organic light-emitting diode device includes formation 1001 of an organic light-emitting diode 600. The method furthermore includes formation 1002 of a resilient optically functional layer 690. The resilient optically functional layer 690 is configured having a first extent x1 along a first direction and a second extent x2 along a second direction. The second direction is perpendicular to the first direction. The method furthermore includes arrangement 1003 of the resilient optically functional layer 690 in the beam path of the organic light-emitting diode 600. The resilient optically functional layer 690 is configured to reduce the second extent x2 in the event of an increase in the first extent x1.

According to one embodiment, the resilient functional layer 690 is configured including a resilient polymer or is formed from a resilient polymer.

According to one embodiment, the resilient optically functional layer 690 is configured including a conversion material or is formed from a conversion material.

According to one embodiment, a refractive index-matched gel is arranged between the resilient optically functional layer 690 and the organic light-emitting diode 600.

Figure 11:
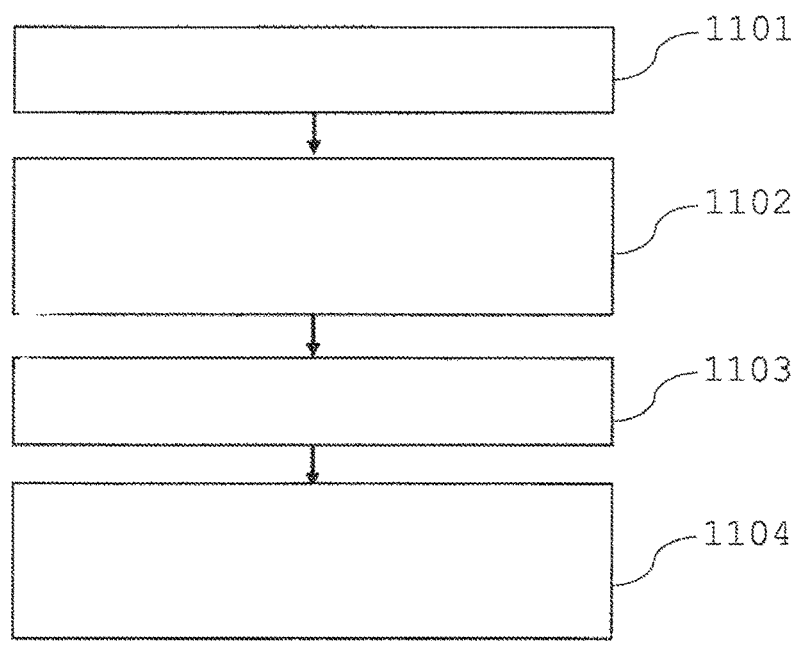
FIG. 11 shows a flow chart of a method for operating an organic light-emitting diode device.

FIG. 11 shows a flow chart of a method for operating an organic light-emitting diode device, which is shown for example in FIG. 2A, FIG. 2B, FIG. 2C, FIG. 3C and FIG. 4.

The method for operating the organic light-emitting diode device may include determination 1101 of a first operating parameter. The method may furthermore include movement 1102 of the optically functional fluid into the first hollow space 210, 310, 410 as a function of the first operating parameter. The method may furthermore include determination 1103 of a second operating parameter. The method may furthermore include movement 1104 of the optically functional fluid into the second hollow space 220, 320, 420 as a function of the second operating parameter.

The first operating parameter may be a supply voltage and/or a supply current of the organic light-emitting diode 200, 400. According to one embodiment, whether the organic light-emitting diode 200, 400 is switched on is determined in 1101. This may, for example, be determined by means of monitoring the supply voltage and/or the supply current. A sensor, for example a voltage sensor and/or current sensor, may for example be provided for monitoring the supply voltage and/or the supply current and be correspondingly arranged in or on the organic light-emitting diode in order to measure the supply voltage and/or the supply current. For example, in the event that exceeding of a predetermined limit value of the supply voltage and/or of the supply current is determined, a first signal may be transmitted from the sensor to the control element 240. The control element 240, which for example includes a processor, for example a microprocessor, may be configured to move, for example pump, the optically functional fluid into the first hollow space 210, 310, 410 by means of the pump likewise contained in the control element 240 after or upon reception of the first signal. To this end, for example, the processor controls the pump accordingly. According to one embodiment, almost all of the optically functional fluid contained in the organic light-emitting diode device is moved, for example pumped, into the first hollow space 210, 310, 410 after or upon reception of the first signal.

According to one embodiment, the second operating parameter is the first operating parameter. The determination 1103 of the second operating parameter may therefore include determination of whether the organic light-emitting diode 200, 400 is switched off. Whether the organic light-emitting diode 200, 400 is switched off may, for example, again be determined by means of monitoring the supply voltage and/or the supply current. A sensor, for example the sensor described above, may also be used in this case. For example, in the event that a predetermined limit value of the supply voltage and/or of the supply current is fallen below, a second signal may be transmitted from the sensor to the control element 240. The control element 240 may be configured to move, for example pump, the optically functional fluid into the second hollow space 220, 320, 420 after or upon reception of the second signal. According to one embodiment, almost all of the optically functional fluid contained in the organic light-emitting diode device is moved into the second hollow space 220, 320, 420 after or upon reception of the second signal. It should be pointed out that the threshold value monitoring are carried out as described above by the sensor itself (of course, a plurality of sensors may also be provided), although it may also be performed by the control element 240, i.e. for example by the processor. In the latter case, the sensor sends one or more measurement value signals to the control element 240, which evaluates them.

According to one embodiment, the movement 1102 of the optically functional fluid into the first hollow space 210, 310, 410 includes movement of a predetermined volume or fraction of the optically functional fluid into the first hollow space 210, 310, 410. To this end, for example, the filling level of the optically functional fluid in the first hollow space 210, 310, 410 and/or in the second hollow space 220, 320, 420 may be determined, for example by means of a filling level sensor. According to one embodiment, the movement 1104 of the optically functional fluid into the second hollow space 220, 320, 420 includes movement of a predetermined volume or fraction of the optically functional fluid into the second hollow space 220, 320, 420. To this end, for example, the filling level of the optically functional fluid in the first hollow space 210, 310, 410 and/or in the second hollow space 220, 320, 420 may be determined, for example by means of the filling level sensor.

Furthermore, the movement 1102 of the optically functional fluid into the first hollow space 210, 310, 410 may include application of an electrical and/or mechanical force. The application of the mechanical force may for example include application of a pressure or reduced pressure, for example by means of a pump, to the optically functional liquid. According to one embodiment, an electrical force is applied to the optically functional fluid, for example by means of applying an electrical potential to the wetting electrodes described above. By means of the electrical potential which is applied to the wetting electrode, it is possible to apply an electrical force to electrically charged particles and/or electrically charged molecules in the optically functional fluid. The electrical potential may be applied in such a way that the optically functional fluid is moved to and fro between the first hollow space 210, 310, 410 and the second hollow space 220, 320, 420 in a similar way to the embodiment described above. According to one embodiment, the movement 1102 of the optically functional fluid into the first hollow space 210, 310, 410 includes application of a first force, for example an electrical and/or mechanical force. The first force acts along a first direction. According to one embodiment, the movement 1104 of the optically functional fluid into the second hollow space 220, 320, 420 includes application of a second force, for example an electrical and/or mechanical force. The second force acts along a second direction. According to one embodiment, the first direction and the second direction are opposite to one another.

The first force or the second force may be a restoring force. According to one embodiment, whether the organic light-emitting diode is switched on is determined. Thus, after switching on is determined, the first signal may be transmitted to the control element 240. For example, the first force is applied to the optically functional fluid after reception of the first signal by the control element 240. Whether the organic light-emitting diode is switched off is furthermore determined. Thus, after switching off is determined, the second signal may be transmitted to the control element 240. For example, the application of the first force is interrupted or suspended after reception of the second signal by the control element 240. If the second force is a restoring force, then the second force acts in the absence of the first force. The effect of the second force may be initiated by interruption or suspension of the first force.

As an alternative or in addition, the method for operating the organic light-emitting diode device may include movement of the optically functional fluid as a function of a predetermined optical parameter. The predetermined optical parameter may, for example, be a predetermined color and/or a predetermined color temperature. The method may, for example, include adjustment of the filling level or of the amount of optically functional fluid in the first hollow space 210, 310, 410 according to the predetermined optical parameter.

For the case in which the optically functional fluid includes the first solvent and the second solvent, for example, instead of moving the optically functional fluid into the first hollow space 210 in 1102, only the first solvent is moved into the first hollow space 210, the second solvent being moved into the second hollow space 220 in 1102 in a manner corresponding thereto. Similarly, instead of moving the optically functional fluid into the second hollow space 220 in 1104, only the first solvent is moved into the second hollow space 220, the second solvent being moved into the first hollow space 210 in 1104 in a manner corresponding thereto.

The movement of the first solvent into the first hollow space 210 as a function of the first operating parameter may be carried out by implementing all output parameters required therefor in the control element 240. For example, how long and with what pressure the pump is operated in order to move the first solvent from the second hollow space 220 into the first hollow space 210 is implemented in the control element 240. The movement of the first solvent into the second hollow space 220 as a function of the second operating parameter may be carried out in a similar way.

Figure 12:
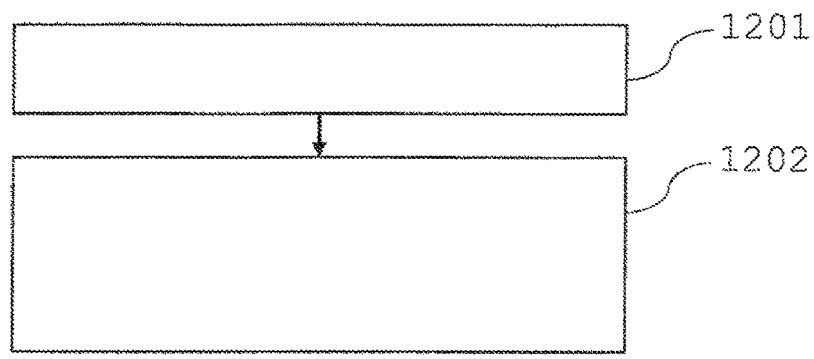
FIG. 12 shows a flow chart of a method for operating an organic light-emitting diode device.

FIG. 12 shows a flow chart of a method for operating an organic light-emitting diode device, which is shown for example in FIG. 5.

The method for operating the organic light-emitting diode device may be configured substantially according to the above-described embodiment of the method for operating the organic light-emitting diode device.

The method for operating the organic light-emitting diode device includes determination 1201 of an operating parameter. The method includes modification 1202 of the volume of a first hollow space 510 by deformation of a resilient frame 570 as a function of the operating parameter which has been determined. The first hollow space 510 and the resilient frame 570 are described in detail above.

The determination 1201 of the operating parameter is configured according to one embodiment of the determination 1201 of the first operating parameter as described above.

Furthermore, the modification 1202 of the volume may include application of an electrical and/or mechanical force. The application of the electrical and/or mechanical force is configured according to an embodiment of the application of the electrical and/or mechanical force as described above in connection with FIG. 11.

The optically functional fluid may be moved from a second hollow space 520 into the first hollow space 510. For example, the resilient frame 570 is extended by the pressure caused by the pumping of the optically functional fluid from the second hollow space 520 into the first hollow space 510, so that the volume is increased.

The method for operating the organic light-emitting diode device may furthermore include determination of a further operating parameter. The determination of the further operating parameter is configured according to one embodiment of determination 1203 of the second operating parameter as described above. The variation 1202 of the volume may, for example, include the pumping of an optically functional fluid from the first hollow space 510 into the second hollow space 520 as a function of the further operating parameter which has been determined. For example, a reduction of the pressure in the first hollow space 510, or a reduced pressure in the first hollow space 510, may lead to the resilient frame 570 contracting, or resuming its original shape, so that the volume of the first hollow space 510 is reduced, or resumes its initial volume.

As an alternative or in addition, the method for operating the organic light-emitting diode device may include movement of the optically functional fluid as a function of a predetermined optical parameter. The predetermined optical parameter may, for example, be a predetermined color and/or a predetermined color temperature. The method may, for example, include an adjusting amount of the optically functional fluid in the first hollow space 510 according to the predetermined optical parameter.

Figure 13:
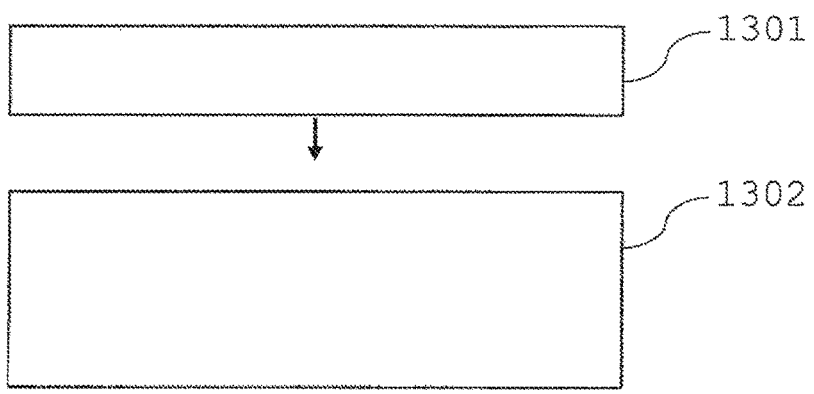
FIG. 13 shows a flow chart of a method for operating an organic light-emitting diode device.

FIG. 13 shows a flow chart of a method for operating an organic light-emitting diode device, which is shown for example in FIG. 6.

The method for operating the organic light-emitting diode device may be configured substantially according to an above-described embodiment of the method for operating the organic light-emitting diode device.

The method for operating the organic light-emitting diode device may include determination 1301 of an operating parameter, for example a supply voltage and/or a supply current of the organic light-emitting diode 600, as described in detail above.

The operating method includes application 1302 of a tensile and/or compressive force onto a resilient optically functional layer 690. The resilient optically functional layer 690 is described in detail above. The application of the tensile force may, for example, include pulling on the resilient optically functional layer 690 along the first extent x1. The application of the compressive force may, for example, include pressing on the resilient optically functional layer 690 along the second extent x2.

According to one embodiment, a predetermined tensile force is applied along the first extent x1 in the event that the organic light-emitting diode 600 is switched off, and is maintained until the organic light-emitting diode 600 is switched on again.

According to one embodiment, the determination 1301 of the operating parameter is optional. According to one embodiment, a user may exert a force on the resilient optically functional layer during operation of the organic light-emitting diode 600, in such a way that the resilient optically functional layer adopts a desired layer thickness. In this way, a user may modify optical properties of the organic light-emitting diode device during operation. Given that the resilient optically functional layer includes a converter material, for example the color and/or the color temperature of the emitted radiation may be modified by pressing and/or pulling on the resilient optically functional layer.

As an alternative or in addition, the method for operating the organic light-emitting diode device may include application of a tensile and/or compressive force onto the resilient optically functional layer 690 as a function of a predetermined optical parameter. The predetermined optical parameter may, for example, be a predetermined color and/or a predetermined color temperature. The method may, for example, include an adjusting thickness of the resilient optically functional layer 690 according to the predetermined optical parameter.

In various embodiments, the method for producing and/or the method for operating the organic light-emitting diode device may include features of the organic light-emitting diode device, and the organic light-emitting diode device may include features of the method for producing and/or the method for operating the organic light-emitting diode device, in such a way that, and insofar as, the features may respectively be applied expediently. This means, for example, that the subject matter of the dependent device claims may be applied correspondingly in a method, and may also be formulated accordingly as dependent method claims.

The present disclosure is not restricted to the embodiments specified. For example, the embodiments shown in FIGS. 1, 2A, 2B, 2C, 3C, 4, 5 and 6 may be combined with one another.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

LIST OF REFERENCES

Light-emitting diode 100, 200, 400, 500, 600
carrier 112, 312, 412
first electrode layer 114
first contact section 116
second contact section 118
first electrode layer 120
insulation barrier 121
organic functional layer structure 122, 322 second electrode 123
encapsulation layer 124
first contact region 132
second contact region 134
bonding layer 136
bonding layer 138
main surface 201, 202
hollow space 210, 220, 410, 420, 510, 520
fluid connection 230, 230b, 530
control element 240
electromagnetic radiation 250, 250', 650
light extraction device 313, 314
enclosing structure 315
hollow space opening 380, 580
optically active region 417
optically inactive region 418
housing 419
housing element 421
control element 540
cover body 560
resilient frame 570
resilient optically functional layer 690
extent X1, X2
method steps 701, 702, 703, 704, 705, 706, 801, 802, 803, 804, 805, 806, 807, 901, 902, 903, 904, 905, 1001, 1002, 1003, 1101, 1102, 1103, 1104, 1201, 1202, 1301, 1302,

The invention claimed is:

1. An organic light-emitting diode device, comprising:
an organic light-emitting diode with an optically active region having a first main surface and a second main surface lying opposite the first main surface;
an optically functional device having a first hollow space and a second hollow space;
a control element;
wherein the first hollow space is arranged on or over the first main surface, and the second hollow space is arranged below the second main surface, wherein an area of the second hollow space is substantially the same as an area of the optically active region of the organic light-emitting diode;
wherein the first hollow space and the second hollow space are connected to one another by means of a fluid connection;
wherein an optically functional fluid is arranged in the optically functional device; and
wherein the control element is configured to move the optically functional fluid to and fro between the first hollow space and the second hollow space.

2. The organic light-emitting diode device as claimed in claim 1, wherein the optically functional fluid comprises a first solvent and a second solvent, and wherein the first solvent and the second solvent are essentially immiscible with one another.

3. The organic light-emitting diode device as claimed in claim 1,
wherein the control element is configured in such a way that, by means of the control element, a first electrical potential can be applied to the at least first wetting electrode and/or a second electrical potential can be applied to the at least second wetting electrode.

4. The organic light-emitting diode device as claimed in claim 1,
wherein the control element is configured to move the optically functional fluid to and fro between the first hollow space and the second hollow space as a function of an operating voltage of the organic light-emitting diode.

5. The organic light-emitting diode device as claimed in claim 1,
wherein the control element comprises a pump.

6. The organic light-emitting diode device as claimed in claim 1,
wherein the optically functional fluid comprises scattering particles and/or the optically functional fluid comprises a conversion material.

7. The organic light-emitting diode device as claimed in claim 1,
wherein the organic light-emitting diode comprises an optically active region and an optically inactive region arranged next to the optically active region;
wherein a surface area of the second hollow space has dimensions that are about as equal as the dimensions of the surface of the optically active region of the organic light-emitting diode.

8. The organic light-emitting diode device as claimed in claim 1, wherein the area of the optically active region of the organic light-emitting diode is the area which the emitted light mainly exits.

9. An organic light-emitting diode device, comprising:
an organic light-emitting diode;
a carrier having an optically active region and an optically inactive region arranged next to the optically active region;
an optically functional device having a first hollow space and a second hollow space;
a housing element in the optically inactive region;
a control element;
wherein the first hollow space and the second hollow space are connected to one another by means of a fluid connection;
wherein the organic light-emitting diode is formed in the optically active region;
wherein the first hollow space is formed on or over the organic light-emitting diode and in the optically active region;
wherein the second hollow space is formed on or over the carrier and between the carrier and the housing element in the optically inactive region;
wherein the first hollow space comprises at least one first wetting electrode and/or the second hollow space comprises at least one second wetting electrode, wherein the at least one first wetting electrode and/or the at least second wetting electrode is/are configured to move at least partially the functional liquid from the first hollow space to the second hollow space and from the second hollow space to the first hollow space by means of electrowetting;
wherein an optically functional fluid is arranged in the optically functional device; and
wherein the control element is configured to move the optically functional fluid to and fro between the first hollow space and the second hollow space.

10. The organic light-emitting diode device as claimed in claim 1,
wherein the organic light-emitting diode comprises an encapsulation and the first hollow space is formed on the encapsulation.

11. The organic light-emitting diode device as claimed in claim 9,
wherein the organic light-emitting diode comprises an encapsulation and the first hollow space is formed on the encapsulation.

12. The organic light-emitting diode device as claimed in claim 9, wherein the first hollow space comprises at least one first wetting electrode and/or the second hollow space comprises at least one second wetting electrode.

13. The organic light-emitting diode device as claimed in claim 9,
wherein the control element is configured to move the optically functional fluid to and fro between the first hollow space and the second hollow space as a function of an operating voltage of the organic light-emitting diode.

14. The organic light-emitting diode device as claimed in claim 9,
wherein the control element comprises a pump.

15. The organic light-emitting diode device as claimed in claim 9,
wherein the optically functional fluid comprises scattering particles and/or the optically functional fluid comprises a conversion material.

16. The organic light-emitting diode device as claimed in claim 9,
wherein the organic light-emitting diode comprises an optically active region and an optically inactive region arranged next to the optically active region;
wherein a surface area of the second hollow space has dimensions that are about as equal as the dimensions of the surface of the optically active region of the organic light-emitting diode.

17. An organic light-emitting diode device, comprising:
an organic light-emitting diode;
an optically functional device;
a control element;
wherein the optically functional device comprises a nonresilient cover body arranged in the beam path of the organic light-emitting diode and a resilient frame;
wherein the nonresilient cover body and the resilient frame form a first hollow space; and
wherein the control element is configured to vary the volume of the first hollow space with deformation of the resilient frame.

18. The organic light-emitting diode device as claimed in claim 17,
wherein the control element comprises a pump.

19. The organic light-emitting diode device as claimed in claim 17,
wherein the optically functional fluid comprises scattering particles and/or the optically functional fluid comprises a conversion material.

* * * * *